United States Patent
Nakanishi

(10) Patent No.: US 6,812,754 B1
(45) Date of Patent: Nov. 2, 2004

(54) CLOCK SYNCHRONIZER WITH OFFSET PREVENTION FUNCTION AGAINST VARIATION OF OUTPUT POTENTIAL OF LOOP FILTER

(75) Inventor: Jingo Nakanishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/030,687

(22) PCT Filed: Jun. 5, 2000

(86) PCT No.: PCT/JP00/03638

§ 371 (c)(1),
(2), (4) Date: Jan. 14, 2002

(87) PCT Pub. No.: WO01/95492

PCT Pub. Date: Dec. 13, 2001

(51) Int. Cl.[7] ............................................. H03K 5/13
(52) U.S. Cl. ................. 327/157; 327/148; 331/DIG. 2; 375/376
(58) Field of Search ................................. 327/146–148, 327/155–157, 243, 291, 536; 331/1 A, DIG. 2; 375/373–376

(56) References Cited

U.S. PATENT DOCUMENTS

| | | | |
|---|---|---|---|
| 4,378,509 A | | 3/1983 | Hatchett et al. ................ 327/5 |
| 5,208,546 A | * | 5/1993 | Nagaraj et al. .............. 327/157 |
| 5,334,953 A | * | 8/1994 | Mijuskovic ..................... 331/8 |
| 5,473,283 A | * | 12/1995 | Luich ............................. 331/8 |
| 5,475,326 A | * | 12/1995 | Masuda ....................... 327/157 |
| 5,687,201 A | * | 11/1997 | McClellan et al. .......... 375/374 |
| 5,703,511 A | | 12/1997 | Okamoto ..................... 327/157 |
| 5,781,048 A | * | 7/1998 | Nakao et al. ................ 327/157 |
| 6,031,429 A | | 2/2000 | Shen ............................. 331/17 |
| 6,385,265 B1 | * | 5/2002 | Duffy et al. ................. 375/374 |

FOREIGN PATENT DOCUMENTS

| | | |
|---|---|---|
| EP | 0 528 651 | 2/1993 |
| EP | 0 583 586 | 2/1994 |
| EP | 0881774 A2 | 12/1998 |
| JP | 07-177027 | 7/1995 |
| JP | 10-13221 | 1/1998 |
| JP | 10-336021 | 12/1998 |
| JP | 11-225069 | 8/1999 |
| WO | WO 96/29785 | 9/1996 |

OTHER PUBLICATIONS

"Monolithic Phase–Locked Loops and Clock Recovery Circuits Theory and Design", Behzad Razavi, IEEE Press, 1996.

* cited by examiner

Primary Examiner—Minh Nguyen
(74) Attorney, Agent, or Firm—McDermott, Will & Emery

(57) ABSTRACT

A change pump circuit included in a clock synchronizer is capable of preventing occurrence of an offset even though an output potential of a loop filter is varied, and includes a control circuit controlling a gate potential of a transistor such that predetermined constant current flows through the transistor connected between the line of a power-supply potential and an output node of the loop filter by a switching circuit, based on the output potential of the loop filter.

16 Claims, 19 Drawing Sheets

TIME t →

TIME t →

CLOCK SYNCHRONIZER WITH OFFSET PREVENTION FUNCTION AGAINST VARIATION OF OUTPUT POTENTIAL OF LOOP FILTER

TECHNICAL FIELD

The present invention relates to a clock synchronizer, and particularly, to a clock synchronizer generating a second clock signal synchronized with a first clock signal.

BACKGROUND ART

Conventionally, a semiconductor integrated circuit device is provided with a PLL (Phase Locked Loop) circuit generating an internal clock signal in synchronization with an external clock signal in order to synchronize the outside and the inside of a chip.

FIG. 23 is a circuit block diagram showing the configuration of such a PLL circuit. In FIG. 23, the PLL circuit includes a phase comparator 121, a charge pump circuit 122, a loop filter 127, a voltage control oscillator (hereinafter referred to as VCO) 130, and a frequency divider 131.

An external clock signal is input into phase comparator 121 as a reference clock signal RCLK. Phase comparator 121 compares the phase of reference clock signal RCLK and that of a feedback clock signal FCLK, and outputs signals UP, DOWN based on the comparison result. When the phase of clock signal FCLK is advanced with respect to the phase of reference clock signal RCLK, signal DOWN is raised to an activated level of "H" level for a time period corresponding to a phase difference, and when the phase of clock signal FCLK is delayed with respect to the phase of reference clock signal RCLK, signal UP is lowered to an activated level of "L" level for a time period corresponding to a phase difference. When there is no difference in the phases of clock signals FCLK and RCLK, signals DOWN, UP are set to be at "H" level and "L" level, respectively, in a pulsive manner.

Charge pump circuit 122 includes a P-channel MOS transistor 123 and a switching element 124 connected in series between the line of a power-supply potential VCC and a node N122; and a switching element 125 and an N-channel MOS transistor 126 connected in series between node N122 and the line of a ground potential GND.

The gate of P-channel MOS transistor 123 is supplied with a constant bias potential VBP, whereas the gate of N-channel MOS transistor 126 is supplied with a constant bias potential VBN. Each of MOS transistors 123, 126 constitutes a constant-current source. Switching element 124 conducts for a period during which signal UP is at the activated level of "L" level. Switching element 125 conducts for a period during which signal DOWN is at the activated level of "H" level.

Loop filter 127 includes a resistance element 128 and a capacitor 129 connected in series between node N122 and ground potential GND. Capacitor 129 is charged and discharged by charge pump circuit 122. The voltage of node N122 is supplied to VCO 130 as a control voltage VC.

VCO 130 outputs an internal clock signal CLK having a frequency corresponding to control voltage VC. Internal clock signal CLK is applied to an internal circuit of the semiconductor integrated circuit device and also to frequency divider 131. Frequency divider 131 divides the frequency of clock signal CLK by N (wherein N is a positive integer) to generate clock signal FCLK. Clock signal FCLK is returned to phase comparator 121.

Control voltage VC is adjusted such that the frequencies and phases of clock signals RCLK and FCLK agree with each other, and then the frequencies and phases of clock signals RCLK and FCLK agree with each other, resulting in a lock state. In the locked state, internal clock signal CLK has a frequency N times as high as that of external clock signal RCLK and is a signal synchronizing with external clock signal RCLK. The internal circuit of the semiconductor integrated circuit device operates in synchronization with internal clock signal CLK. Therefore, the outside and the inside of the chip can be synchronized.

However, the conventional PLL circuit had problems as described below.

Now, a case is considered where reference clock signal RCLK and feedback clock signal FCLK agree in phase. In this case, signal UP is lowered to "L" level in a pulsive manner for a certain period of time with the same cycle as that of clock signals RCLK, FCLK. Likewise, signal DOWN is raised to "H" level in a pulsive manner for the same period of time and with the same cycle as that of signal UP. The reason why signals UP, DOWN are set to be at "L" level and "H" level in a pulsive manner even though clock signals RCLK and FCLK agree in phase with each other is to avoid a dead band being created.

At this moment, if current Ic flowing through P-channel MOS transistor 123 is the same as current Id flowing through N-channel MOS transistor 126, signals UP and DOWN will have the same pulse width, so that the exactly same amount of charge is charged and discharged without the amount of charge in capacitor 129 of loop filter 127 changed. Thus, no change occurs in control voltage VC, and VCO 130 keeps outputting clock signal CLK having the same frequency X (Hz). As a result, the PLL circuit will be in the locked state in a state having no phase difference between clock signals RCLK and FCLK.

However, when there is no agreement between charging current Ic and discharging current Id, the locked state cannot be obtained in the state having no phase difference between clock signals RCLK and FCLK. For example, considering the case where charging current Ic is larger than discharging current Id, if signals UP and DOWN have the same pulse width, the amount of charge that is charged by charging current Ic will be unequal to the amount of charge that is discharged by discharging current Id. To equalize these amount of charges, the pulse width of signal DOWN must be made larger than the pulse width of signal UP.

Then, the state where the pulse width of signal DOWN is larger than the pulse width of signal UP means a state where the phase of feedback clock signal FCLK is delayed with respect to the phase of reference clock signal RCLK, and the PLL circuit is locked in this state. This generates a steady phase difference, i.e. an offset, between clock signals RCLK and FCLK. Same applies to the case where discharging current Id is larger than charging current Ic. In sum, in the PLL circuit, if there is no agreement in magnitude between charging current Ic and discharging current Id, an offset will occur.

Next, a case is considered where charging current Ic and discharging current Id disagree with each other in magnitude. In designing of the PLL circuit, assuming that the operating frequency of the PLL circuit is X (Hz), VCO 130 obtains a control voltage Y (V) oscillated at X (Hz), and the sizes of MOS transistors 123, 126 and the levels of bias potentials VBP, VBN are determined such that charging current Ic and discharging current Id are equal to each other when control voltage VC is Y (V). Therefore, when the PLL circuit operates as designed, charging current Ic and discharging current Id are equal to each other, and hence the locked state is attained in the state having no phase difference between clock signals RCLK and FCLK.

However, due to variations of a manufacturing process, an environment temperature and power-supply voltage VCC, control voltage VC at the time when output clock signal CLK of VCO 130 attains to X (Hz) is easily varied from Y (V). Moreover, when the PLL circuit is operated at a frequency other than X (Hz), control voltage VC in the locked state is a value different from Y (V). Therefore, in such cases, charging current Ic and discharging current Id are unequal, and an offset occurs.

Disclosure of the Invention

Therefore, a main object of the present invention is to provide a clock synchronizer capable of inhibiting occurrence of an offset.

An object of the present invention can be achieved by providing a clock synchronizer generating a second clock signal synchronized with a first clock signal, including a phase difference detection circuit detecting a phase difference between the first and second dock signals, and setting a first control signal to be at an activated level for a time period corresponding to the phase difference; a loop filter connected to a predetermined node; a current-supply circuit supplying current to the loop filter in response to the first control signal from the phase difference detection circuit; and a clock generating circuit generating the second dock signal in accordance with a potential of the predetermined node. The current-supply circuit includes a variable current source whose output current can be controlled, a first switching circuit passing output current of the variable current source through the loop filter in response to that the first signal is set to be at the activated level, and a first control circuit: controlling the variable current source such that predetermined constant current flows from the variable current source to the loop filter, based on the potential of the predetermined node.

A main advantage of the present invention is that the variable current source is controlled such that constant current flows from the variable current source to the loop filter, based on the potential of the predetermined node, so that constant current can flow from the variable current source to the loop filter even when the potential of the predetermined node is varied, and thus occurrence of an offset can be inhibited.

Preferably, the variable current source includes a first transistor of a first conductivity type whose input electrode receives a first control potential. The first switching circuit connects the first transistor between a line of a first power-supply potential and the loop filter in response to that the first control signal is set to be at the activated level, and the first control circuit controls the first control potential such that predetermined constant current flows through the first transistor connected between the line of the first power-supply potential and the loop filter, based on the potential of the predetermined node. In this case, the potential of the input electrode of the first transistor is controlled such that constant current flows through the first transistor, based on the potential of the predetermined node, so that constant current can flow through the first transistor even when the potential of the predetermined node is varied, and thus occurrence of the offset can be inhibited.

More preferably, the first control circuit includes a second transistor of a first conductivity type whose first electrode is connected to the line of the first power-supply potential, and whose input electrode is connected to a second electrode of the second transistor, and outputting the first control potential from the second electrode; a third transistor of a second conductivity type whose first electrode is connected to a second electrode of the second transistor and whose input electrode receives the potential of the predetermined node; and a first resistance element connected between a second electrode of the third transistor and a line of a second power-supply potential. This facilitates constitution of the first control circuit.

More preferably, the first control circuit further includes a second resistance element connected between the second electrode of the second transistor and the line of the second power-supply potential. In this case, even when the potential of the predetermined node is set as the second power-supply potential and the third transistor is rendered non-conductive, current can flow through the first and second transistors, and thus the current-supply circuit can be prevented from being inoperative.

More preferably, the variable current source further includes a fourth transistor of a first conductivity type, connected in parallel with the first transistor, whose input electrode receives a constant bias potential. In this case, even when the potential of the predetermined node is set as the second power-supply potential and the third transistor is rendered non-conductive, current can flow through the fourth transistor, and thus the current-supply circuit can be prevented from being inoperative.

More preferably, the clock synchronizer includes a lock detection circuit detecting whether or not the phase difference between the first and second clock signals is smaller than a predetermined level, setting a lock detection signal to be at an activated level when it is smaller, and setting the lock detection signal to be at an inactivated level when it is larger. The variable current source further includes a second transistor of a first conductivity type whose input electrode receives a constant bias potential. The first switching circuit connects the first transistor between the line of the first power-supply potential and the loop filter when the lock detection signal is at an activated level, and connecting the second transistor between the line of the first power-supply potential and the loop filter when the lock detection signal is at an inactivated level, in response to that the first control signal is set to be at an activated level. In this case, the second transistor through which current flows in accordance with the potential of the predetermined node is used when not in the locked state, whereas the first transistor through which constant current flows irrespective of the potential of the predetermined node is used when in the locked state, so that the lock-in time is made shorter compared to the case where only the first transistor is used.

More preferably, the clock synchronizer further includes a lock detection circuit detecting whether or not the phase difference between the first and second clock signals is smaller than a predetermined level, setting a lock detection signal to be at an activated level when it is smaller, and setting the lock detection signal to be at an inactivated level when it is larger. The variable current source further includes a second transistor of a first conductivity type whose input electrode receives a second control potential. The first switching circuit connects the first transistor between the line of the first power-supply potential and the loop filter when the lock detection signal is at an activated level, and connecting the second transistor between the line of the first power-supply potential and the loop filter when the lock detection signal is at an inactivated level, in response to that the first control signal is set to be at an activated level. The current-supply circuit further includes a second control circuit controlling the second control potential such that current flowing through the second transistor connected between the line of the first power-supply potential and the loop filter is increased in accordance with a potential difference between the first power-supply potential and a potential of the predetermined node, based on the potential of the predetermined node. In this case, the second transistor through which current flows in accordance with the potential difference between the first power-supply potential and the potential of the predetermined node is used when not in the locked state, whereas the first transistor through which constant current flows irrespective of the potential of the predetermined node is used when in the locked state, so that the lock-in time is made shorter compared to the case where only the first transistor is used.

More preferably, the first control signal is a signal for advancing a phase of the second clock signal. The phase difference detection circuit sets the first control signal to be at an activated level for a time period corresponding to a phase difference between the first and second clock signals when the phase of the second clock signal is delayed with respect to the first clock signal, sets a second control signal for delaying the phase of the second clock signal to be at an activated level for a time period corresponding to a phase difference between the first and second dock signals when the phase of the second clock signal is advanced with respect to the first clock signal, and sets the first and second control signals to be at an activated level for a predetermined period of time when phases of the first and second dock signals agree with each other. The current-supply circuit supplies current of a first polarity to the loop filter in response to that the first control signal is set to be at an activated level, and also supplies current of a second polarity to the loop filter in response to that the second control signal is set to be at an activated level. In this case, the phase of the second clock signal can be advanced by the first control signal, and the phase of the second clock signal can be delayed by the second control signal.

More preferably, the variable current source further includes a second transistor of a second conductivity type whose input electrode receives a second control potential. The current-supply circuit includes a second switching circuit connecting the second transistor between the loop filter and the line of the second power-supply potential in response to that the second control signal is set to be at an activated level; and a second control circuit controlling the second control potential such that the predetermined constant current flows through the second transistor connected between the loop filter and the line of the second power-supply potential, based on a potential of the predetermined node. In this case, even when the potential of the predetermined node is varied, current of the first polarity and the current of the second polarity supplied from the current-supply circuit to the loop filter may be equalized, and thus occurrence of an offset can be prevented.

Preferably, the clock synchronizer further includes a precharge circuit precharging the predetermined node to be at a predetermined potential in response to application of the first and second power-supply potentials. In this case, the time period from power-up to lock-in can be shortened.

More preferably, the current-supply circuit further includes a second transistor of a second conductivity type whose input electrode receives a constant bias potential, and a second switching circuit connecting the second transistor between the loop filter and the line of the second power-supply potential in response to that the second control signal is set to be at an activated level. In this case, though current flowing through the second transistor varies in accordance with the potential of the predetermined node, current flowing through the first transistor is maintained to be constant, not depending on the potential of the predetermined node, so that occurrence of an offset can be inhibited.

More preferably, the clock synchronizer further includes a precharge circuit precharging the predetermined node to be at the first power-supply potential in response to application of the first and second power-supply potentials. In this case, the time period from power-up to lock-in can be shortened.

More preferably, the first control signal is a signal for delaying the phase of the second clock signal. The phase difference detection circuit sets the first control signal to be at an activated level for a time period corresponding to a phase difference between the first and second clock signals when the phase of the second clock signal is advanced with respect to the first clock signal, sets a second control signal for advancing the phase of the second clock signal to be at an activated level for a time period corresponding to a phase difference between the first and second clock signals when the phase of the second clock signal is delayed with respect to the first clock signal, and sets the first and second control signals to be at an activated level for a predetermined period of time when the phases of the first and second clock signals agree with each other. The current-supply circuit supplies current of a first polarity to the loop filter in response to that the first control signal is set to be at an activated level, and also supplies current of a second polarity to the loop filter in response to that the second control signal is set to be at an activated level. In this case, the phase of the second clock signal can be delayed by the first control signal, and the phase of the second clock signal can be advanced by the second control signal.

More preferably, the current-supply circuit further includes a second transistor of a second conductivity type whose input electrode receives a constant bias potential, and a second switching circuit connecting the second transistor between the loop filter and the line of the second power-supply potential, in response to that the second control signal is set to be at an activated level. In this case, though current flowing through the second transistor varies in accordance with the potential of the predetermined node, current flowing through the first transistor is maintained to the constant, not depending on the potential of the predetermined node, so that occurrence of the offset can be inhibited.

More preferably, the clock synchronizer further includes a precharge circuit precharging the predetermined node to be at the first power-supply potential in response to application of the first and second power-supply potentials. In this case, the time period from power-up to lock-in can be shortened.

More preferably, the variable current source includes a variable potential source whose output potential can be controlled, and a transistor whose input electrode receives a constant bias potential. The first switching circuit connects the transistor between an output node of the variable potential source and the loop filter, in response to that the first control signal is set to be at an activated level. The first control circuit controls the variable potential source such that predetermined constant current flows through the transistor connected between the output node of the variable potential source and the loop filter, based on a potential of the predetermined node. In this case, the variable potential source is controlled such that constant current flows through the transistor, based on the potential of the predetermined node, so that constant current can flow through the transistor even when the potential of the predetermined node is varied, and thus occurrence of an offset can be prevented.

More preferably, the variable current source includes a variable potential source whose output potential can be controlled, and a transistor whose in put electrode receives a constant control potential. The first switching circuit connects the transistor between an output node of the variable potential source and the loop filter in response to that the first control signal is set to be at an activated level. The first control circuit controls the control potential and the variable potential source such that predetermined constant current flows through the transistor connected between the output node of the variable potential source and the loop filter, based on a potential of the predetermined node. In this case, the control potential and the variable potential source are controlled such that constant current flows through the transistor, based on the potential of the predetermined node, so that constant current can flow through the transistor even when the potential of the predetermined node is varied, and thus occurrence of an offset can be inhibited.

More preferably, the loop filter includes a resistance element and a capacitor connected in series between the predetermined node and a line of a reference potential. In this case, charge applied from the current-supply circuit to the loop filter is charged to the capacitor.

An object of the present invention is also achieved by providing a clock synchronizer generating a second clock signal synchronized with a first clock signal, including a phase difference detection circuit detecting a phase difference between the first and second clock signals and setting a control signal to be at an activated level for a time period corresponding to the phase difference; a loop filter connected to a predetermined node; a current-supply circuit supplying current to the loop filter in response to a control signal from the phase difference detection circuit; and a clock generating circuit generating the second dock signal in accordance with a control potential. The current-supply circuit includes a transistor whose input electrode receives the control potential, a switching circuit connecting the transistor between a line of a power-supply potential and the loop filter, in response to that the control signal is set to be at an activated level, and a control circuit controlling the control potential such that predetermined constant current flows through the transistor connected between the line of the power-supply potential and the loop filter, based on a potential of the predetermined node.

In this case, the control potential is controlled such that constant current flows through the transistor, based on the potential of the predetermined node, so that constant current can flow through the transistor even when the output potential of the predetermined node is varied, and thus occurrence of an offset can be inhibited. Moreover, the control potential is also used for generating the second clock signal, so that circuit configuration may be simplified.

An object of the present invention is further achieved by providing a clock synchronizer generating a second dock signal synchronized with a first clock signal, including a phase difference detection circuit detecting a phase difference between the first and second clock signals, and setting a control signal to be at an activated level for a time period corresponding to the phase difference; a loop filter including a resistance element and a capacitor connected in series between a predetermined node and a line of a reference potential; a current-supply circuit supplying current to the loop filter in response to a control signal from the phase difference detection circuit; and a clock generating circuit generating the second clock signal in accordance with a potential of the predetermined node. The current-supply circuit includes a transistor whose input electrode receives a control potential, a switching circuit connecting the transistor between a line of a power-supply potential and the loop filter, in response to that the control signal is set to be at an activated level, and a control circuit controlling the control potential such that predetermined constant current flows through the transistor connected between the line of the power-supply potential and the loop filter, based on a potential of a node between the resistance element and a capacitor.

In this case, the control potential is controlled such that constant current flows through the transistor, based on the potential of a node between the resistance element and the capacitor of the loop filter, so that constant current can flow through the transistor even when the potential of the predetermined node is varied, and thus occurrence of an offset can be inhibited.

BEST MODE FOR CARRYING OUT THE INVENTION

A clock synchronizer according to the present invention will be described below with reference to the drawings.

First Embodiment

Figure 1:
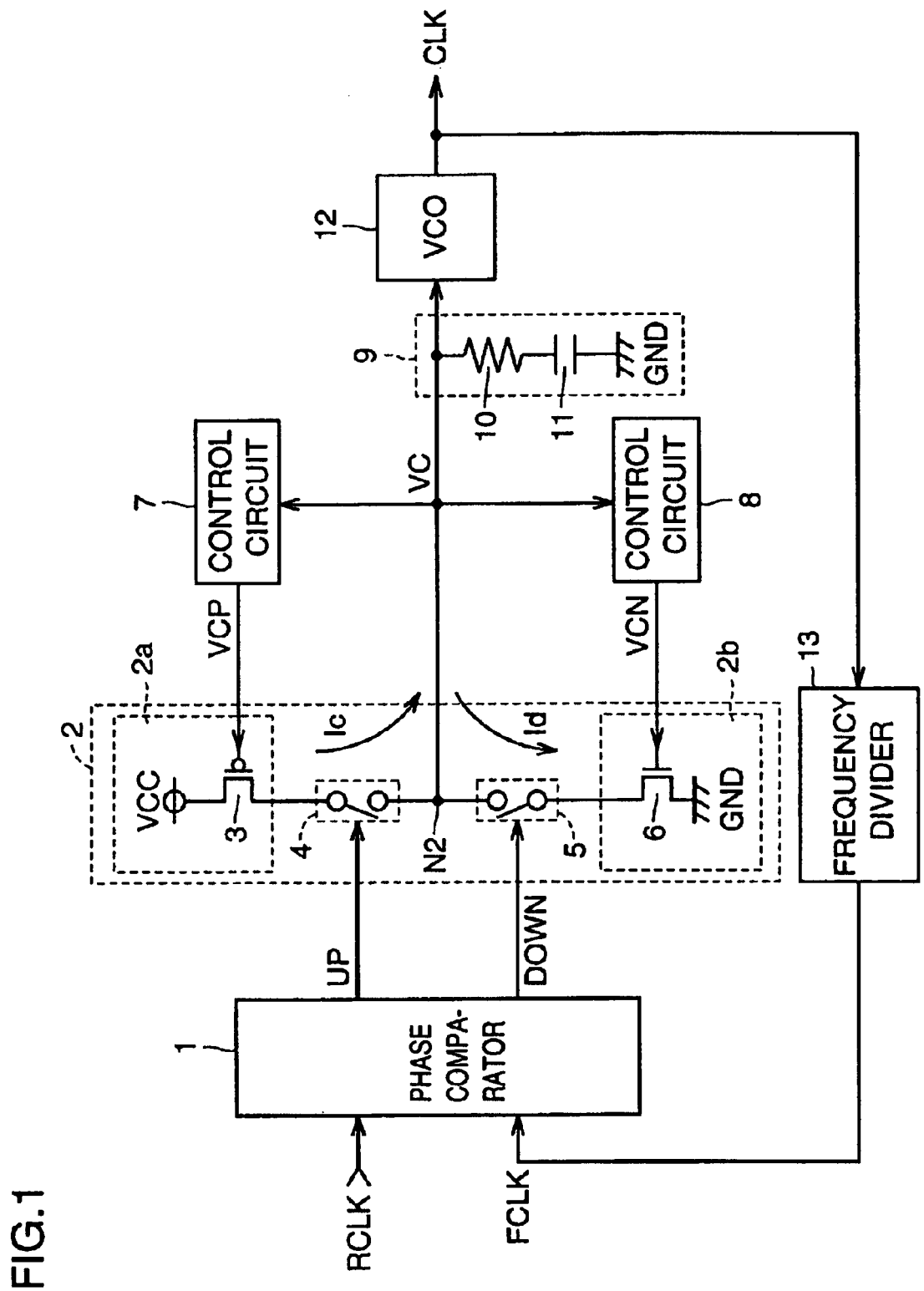
FIG. 1 is a circuit block diagram showing the configuration of a PLL circuit according to the first embodiment of the present invention.

FIG. 1 is a circuit block diagram showing the configuration of a PLL circuit according to the first embodiment of the present invention. In FIG. 1, the PLL circuit includes a phase comparator 1, a charge pump circuit 2, control circuits 7, 8, a loop filter 9, a VCO 12, and a frequency divider 13.

Figure 2:
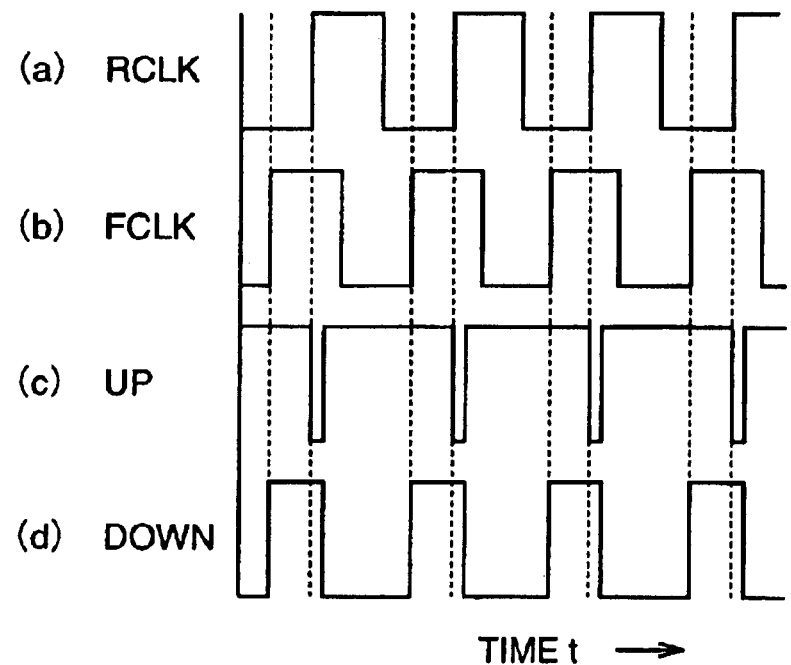
FIG. 2 is a time chart illustrating the operation of a phase comparator shown in FIG. 1.

Phase comparator 1 compares the phase of a reference clock signal RCLK, which is an external clock signal, and the phase of a feedback clock signal FCLK, and outputs signals UP, DOWN based on the comparison result. When the phase of feedback clock signal FCLK is advanced with respect to the phase of reference clock signal RCLK, as shown in FIG. 2, signal UP is lowered to "L" level in a pulsive manner for a certain period of time in response to the rising edge of reference clock signal RCLK, and signal DOWN is raised to "H" level in response to the rising edge of feedback clock signal FCLK and is lowered to "L" level in response to the rising edge of signal UP. Thus, in this case, the pulse width of signal DOWN is wider than the pulse width of signal UP.

Figure 3:
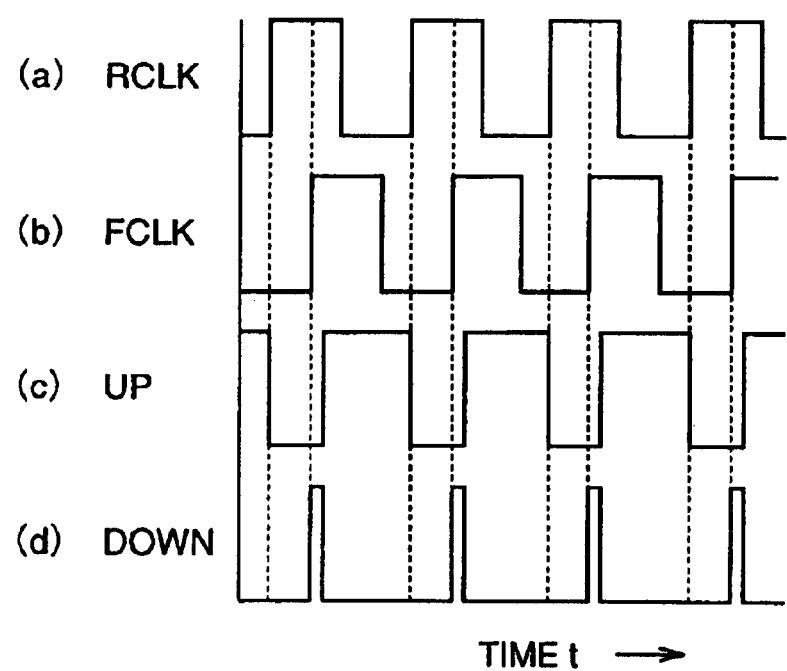
FIG. 3 is another time chart illustrating the operation of the phase comparator shown in FIG. 1.

When the phase of feedback clock signal FCLK is delayed with respect to the phase of reference clock signal RCLK, as shown in FIG. 3, signal DOWN is raised to "H" level in a pulsive manner for a certain period of time in response to the rising edge of feedback clock signal FCLK, and signal UP is lowered to "L" level in response to the rising edge of reference clock signal RCLK and is raised to "H" level in response to the trailing edge of signal DOWN. Therefore, in this case, the pulse width of signal UP is wider than the pulse width of signal DOWN.

Figure 4:
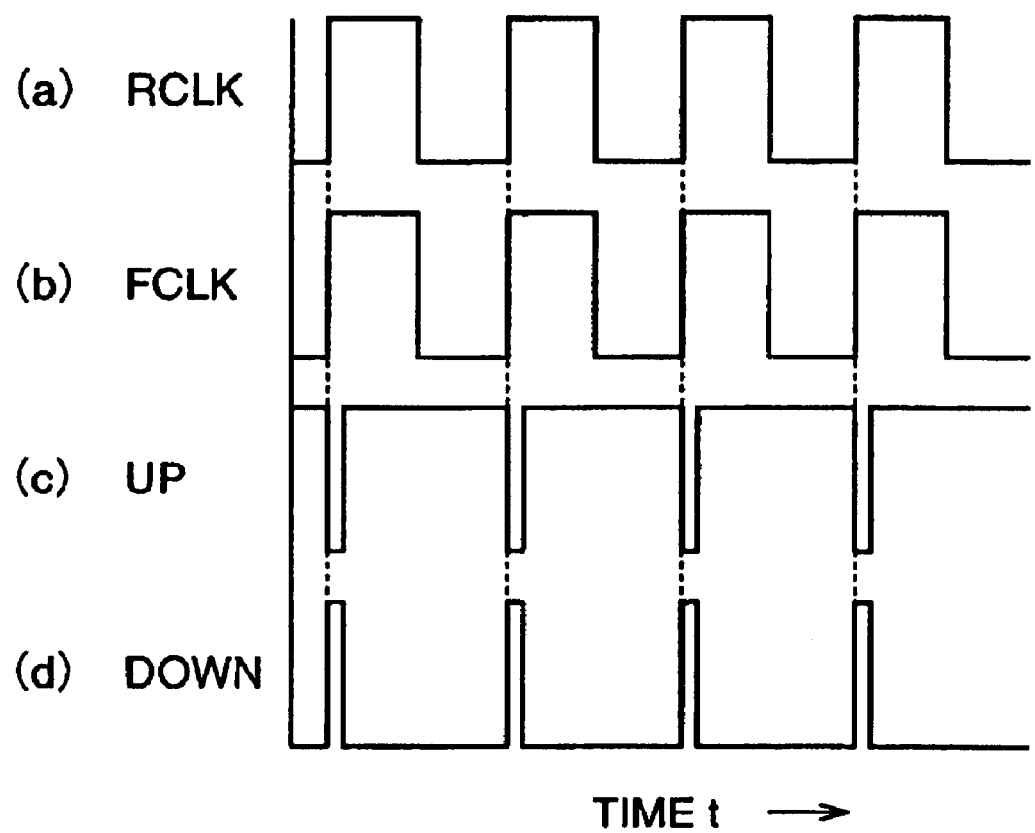
FIG. 4 is a further time chart illustrating the operation of the phase comparator shown in FIG. 1.

When the phase of feedback clock signal FCLK and the phase of reference clock signal RCLK agree with each other, as shown in FIG. 4, signal UP is lowered to "L" level in a pulsive manner for a certain period of time in response to the rising edges of clock signals RCLK, FCLK, and signal DOWN is raised to "H" level in a pulsive manner for a certain period of time in response to the rising edges of clock signals FCLK, RCLK. Therefore, in this case, the pulse width of signal UP is equal to the pulse width of signal DOWN.

Referring back to FIG. 1, charge pump circuit 2 includes a P-channel MOS transistor 3 and a switching element 4 connected in series between the line of a power-supply potential VCC and a node N2; and a switching element 5 and an N-channel MOS transistor 6 connected in series between node N2 and the line of a ground potential GND. The gate of P-channel MOS transistor 3 receives a control potential VCP generated at control circuit 7. P-channel MOS transistor 3 constitutes a variable current source 2a, through which current Ic of a value according to control potential VCP flows. The gate of N-channel MOS transistor 6 receives a control potential VCN generated at control circuit 8. N-channel MOS transistor 6 constitutes a variable current source 2b, through which current Id of a value according to control potential VCN flows.

Switching element 4 conducts for a period during which signal UP is at the activated level of "L" level. Switching element 4 is constituted by a transistor, for example, a P-channel MOS transistor connected between the drain of P-channel MOS transistor 3 and node N2, the gate of which receiving signal UP.

Switching element 5 conducts for a period during which signal DOWN is at the activated level of "H" level. Switching element 5 is constituted by a transistor, for example, an N-channel MOS transistor connected between the drain of N-channel MOS transistor 6 and node N2, the gate of which receiving signal DOWN.

Figure 5:
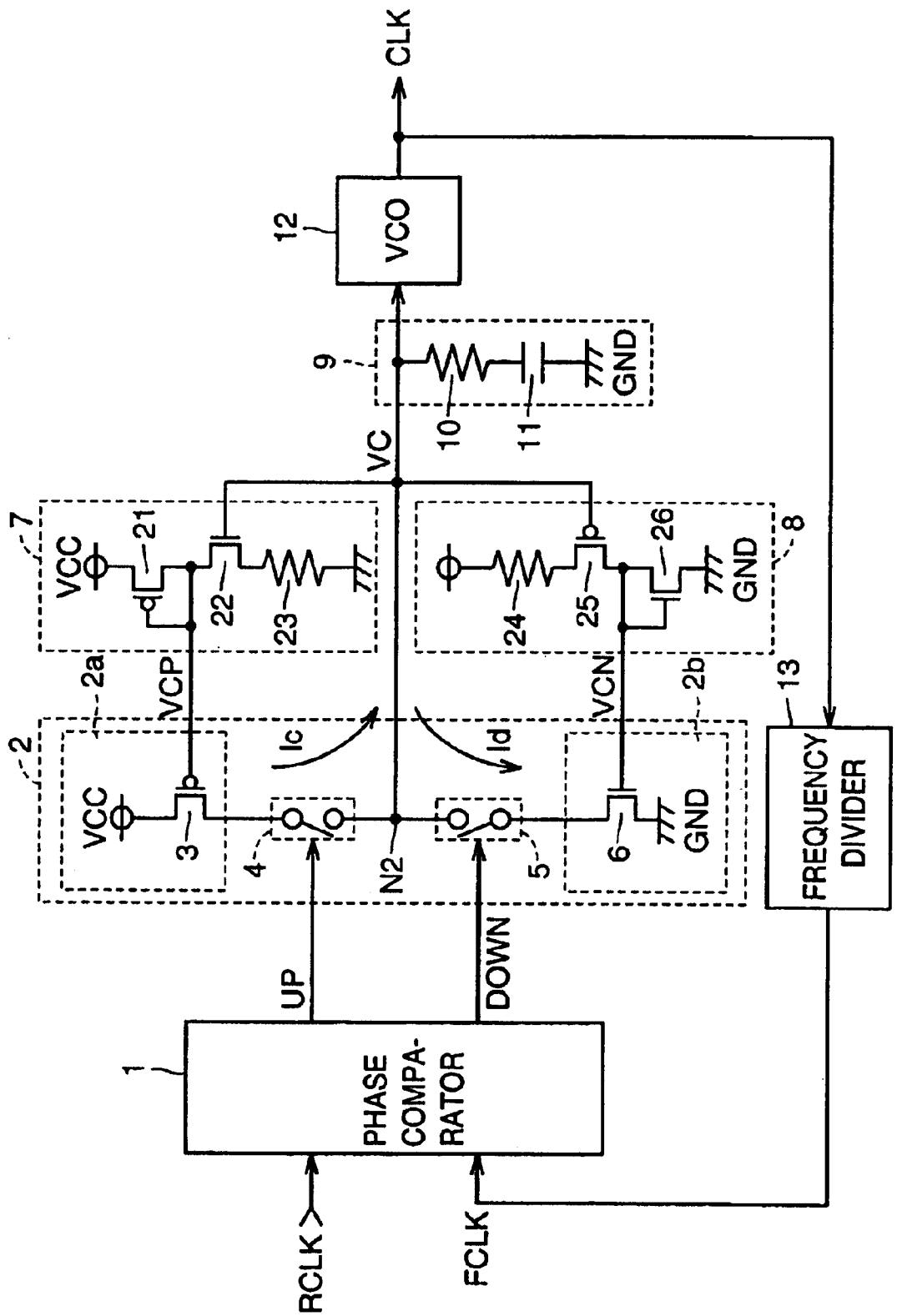
FIG. 5 is a circuit block diagram showing in detail the configuration of a control circuit shown in FIG. 1.

Control circuit 7 includes, as shown in FIG. 5, a P-channel MOS transistor 21, an N-channel MOS transistor 22 and a resistance element 23 connected in series between the line of power-supply potential VCC and the line of ground potential GND. The gate of P-channel MOS transistor 21 is connected to the drain thereof and also to the gate of P-channel MOS transistor 3 in charge pump circuit 2. A gate potential of P-channel MOS transistor 21 is to be control potential VCP. The gate of N-channel MOS transistor 22 is connected to node N2.

This PLL circuit is designed to be in a locked state when the potential of node N2, i.e. control potential VC, is VCC/2. If control potential VC becomes higher than VCC/2, the resistance value of N-channel MOS transistor 22 is reduced, lowering control potential VCP. Thus, the reduced amount of current Ic that is generated due to increase of drain potential VC of P-channel MOS transistor 3 and the increased amount of current Ic that is generated due to lowering of gate potential VCP of P-channel MOS transistor 3 are canceled out, causing no variation in the current flowing through P-channel MOS transistor 3.

On the contrary, if control potential VC becomes lower than VCC/2, the resistance value of N-channel MOS transistor 22 is increased, making control potential VCP higher. Thus, the increased amount of current Ic that is generated due to reduction of drain potential VC of P-channel MOS transistor 3 and the reduced amount of current Ic that is generated due to increase of gate potential VCP of P-channel MOS transistor 3 are canceled out, causing no variation in the current flowing through P-channel MOS transistor 3. Therefore, current Ic flowing through P-channel MOS transistor 3 when switching element 4 is conducting is maintained to be constant, irrespective of the level of control potential VC.

Control circuit 8 includes, as shown in FIG. 5, a resistance element 24, a P-channel MOS transistor 25 and an N-channel MOS transistor 26 connected in series between the line of power-supply potential VCC and the line of ground potential GND. The gate of N-channel MOS transistor 26 is connected to the drain thereof, and also to the gate of N-channel MOS transistor 6 in charge pump circuit 2. The gate potential of N-channel MOS transistor 26 is to be control potential VCN. The gate of P-channel MOS transistor 25 is connected to node N2.

If control potential VC becomes higher than VCC/2, the resistance value of P-channel MOS transistor 25 is increased, lowering control potential VCN. Therefore, the increased amount of current Id that is generated due to increase of drain potential VC of N-channel MOS transistor 6 and the reduced amount of current Id that is generated due to lowering of gate potential VCP of N-channel MOS transistor 6 are canceled out, causing no variation in current Id flowing through N-channel MOS transistor 6.

On the contrary, if control potential VC becomes lower than VCC/2, the resistance value of P-channel MOS transistor 25 is reduced, and control potential VCN is increased. Therefore, the reduced amount of current Id that is generated due to lowering of drain potential VC of N-channel MOS transistor 6 and the increased amount of current Id that is generated due to increase of gate potential VCP of N-channel MOS transistor 6 are canceled out, causing no variation in current Id flowing through N-channel MOS transistor 6. Therefore, there is no change in current Id flowing through N-channel MOS transistor 6 when switching element 5 is conducting, irrespective of the level of control potential VC. From the description above, charging current Ic and discharging current Id are always maintained at the same value, and unlike the conventional case, no offset occurs.

Loop filter 9 includes a resistance element 10 and a capacitor 11 connected in series between node N2 and the line of ground potential GND. Capacitor 11 is charged and discharged by charge pump circuit 2.

Figure 6:
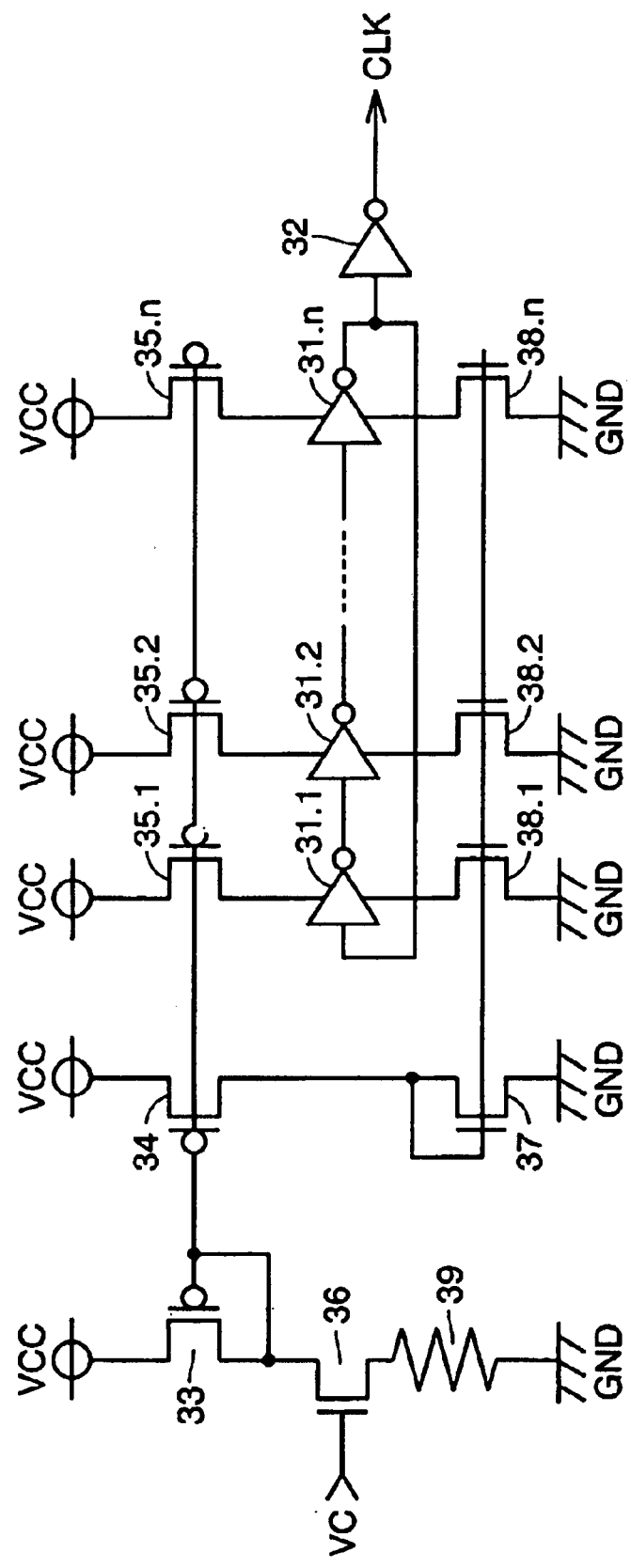
FIG. 6 is a circuit diagram showing the configuration of VCO shown in FIG. 1.

VCO 12 includes, as shown in FIG. 6, inverters 31.1 to 31.$n$ (wherein n is an odd number equal to or higher than 3), 32; P-channel MOS transistors 33, 34, 35.1 to 35.$n$; N-channel MOS transistors 36, 37, 38.1 to 38.$n$; and a resistance element 39.

P-channel MOS transistor 33, N-channel MOS transistor 36 and resistance element 39 is connected in series between the line of power-supply potential VCC and the line of ground potential GND. P-channel MOS transistor 34 and N-channel MOS transistor 37 are connected in series between the line of power-supply potential VCC and the line of ground potential GND. The gate of N-channel MOS transistor 36 receives control potential VC. The gates of P-channel MOS transistors 33, 34 are both connected to the drain of P-channel MOS transistor 33. P-channel MOS transistors 33 and 34 constitute a current mirror circuit. The gate of N-channel MOS transistor 37 is connected to the drain thereof.

Current of a value according to control potential VC flows through N-channel MOS transistor 36. MOS transistors 36 and 33 are connected in series, MOS transistors 33 and 34 constitute the current mirror circuit, and MOS transistors 34 and 37 are connected in series, so that current according to control potential VC flows through MOS transistors 34, 37.

Inverters 31.1 to 31.$n$ are ring-connected. N-channel MOS transistors 35.1 to 35.$n$ are respectively connected between the line of power-supply potential VCC and the power-supply nodes of inverters 31.1 to 31.$n$, and the gate of each transistor is connected altogether to the gate of P-channel MOS transistor 34. P-channel MOS transistors 38.1 to 38.$n$ are respectively connected between the line of ground potential GND and ground nodes of inverters 31.1 to 31.$n$, and the gate of each transistor is altogether connected to the gate of N-channel MOS transistor 37. Current of a value according to control potential VC flows through MOS transistors 35.1 to 35.$n$ and 38.1 to 38.$n$. An output signal of inverter 31.$n$ is inverted at inverter 32 to be an internal clock signal CLK.

When control potential VC is increased, the resistance value of N-channel MOS transistor 36 is reduced, increasing the current flowing through P-channel MOS transistors 33, 34, 35.1 to 35.$n$ and N-channel MOS transistors 36, 37, 38.1 to 38.$n$, and drivability of inverters 31.1 to 31.$n$ is increased and the frequency of internal clock signal CLK becomes higher.

When control potential VC is lowered, the resistance value of N-channel MOS transistor 36 is increased, reducing the current flowing through P-channel MOS transistors 33, 34, 35.1 to 35.$n$ and N-channel MOS transistors 36, 37, 38.1 to 38.$n$, and drivability of inverters 31.1 to 31.$n$ is also reduced and the frequency of internal clock signal CLK is lowered.

Referring back to FIG. 1, internal clock signal CLK generated at VCO 12 is applied to an internal circuit of the semiconductor integrated circuit device and also to a frequency divider 13. Frequency divider 13 divides the frequency of internal clock signal CLK by N to generate clock signal FCLK. Clock signal FCLK is returned to phase comparator 1.

Next, the operation of the PLL circuit shown in FIGS. 1 to 6 will be described. When the phase of feedback clock signal FCLK is advanced with respect to the phase of reference clock signal RCLK, the pulse width of signal DOWN is wider than the pulse width of signal UP, and the amount of charge flowing into node N2 becomes smaller than the amount of charge flowing out of node N2, gradually lowering control potential VC. This gradually lowers the frequency of output clock signal CLK of VCO 12, resulting in agreement of the phase of feedback clock signal FCLK with the phase of reference clock signal RCLK.

When the phase of feedback clock signal FCLK is delayed with respect to the phase of reference clock signal RCLK, the pulse width of signal UP is wider than the pulse width of signal DOWN, and the amount of charge flowing into node N2 becomes larger than the amount of charge flowing out of node N2, gradually raising control potential VC. This gradually raises the frequency of output clock signal CLK of VCO 12, resulting in agreement of the phase of feedback clock signal FCLK with the phase of reference clock signal RCLK.

When the phase of feedback clock signal FCLK agrees with the phase of reference clock signal RCLK and when in a locked state, the pulse width of signals UP and DOWN are equal to each other, the amount of charge flowing into node N2 and the amount of charge flowing out of node N2 are equal to each other, and there is no change in control potential VC. Therefore, the frequency of output clock signal CLK of VCO 12 is maintained to be constant.

In the first embodiment, when control potential VC is higher than VCC/2, gate potentials VCP, VCN of MOS transistors 3, 6 are lowered, and when control potential VC is lower than VCC/2, the gate potential VCP, VCN of MOS transistors 3, 6 are increased, so that current Ic, Id flowing through MOS transistors 3, 6 at the time of conduction of switching elements 4, 6 can be maintained to be constant, irrespective of the level of control potential Vc. Therefore, even though there are variations in the manufacturing process, the environment temperature, power-supply voltage VCC and so forth, or when a frequency of a value other than the design value is used for operation, no offset occurs.

Figure 7:
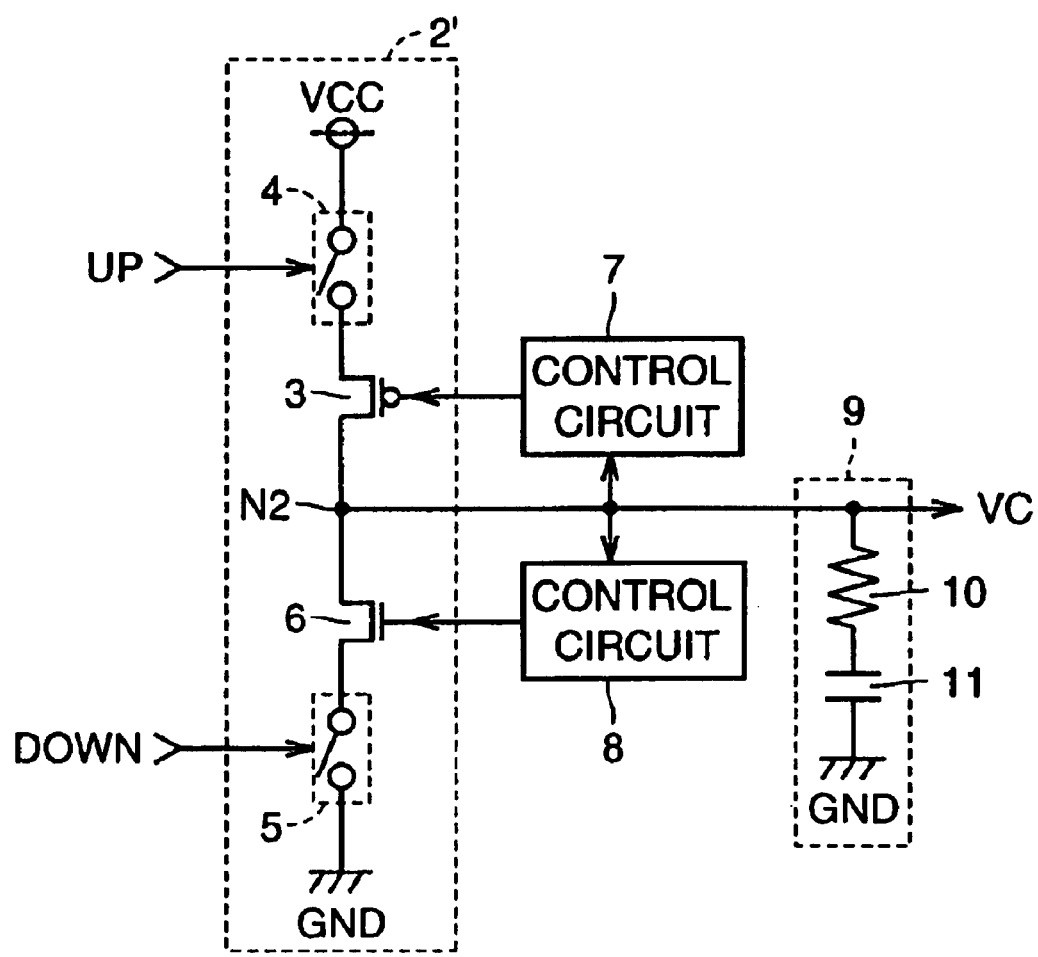
FIG. 7 is a circuit block diagram showing a modification of the first embodiment.

Various modifications of the first embodiment will be described below. The modification in FIG. 7 is different from the PLL circuit in FIG. 1 in that P-channel MOS transistor 3 and switching element 4 are exchanged in their positions, and also N-channel MOS transistor 6 and switching element 5 are exchanged in their positions. Also in this modification, the same effect as that of the PLL circuit in FIG. 1 can be obtained.

Figure 8:
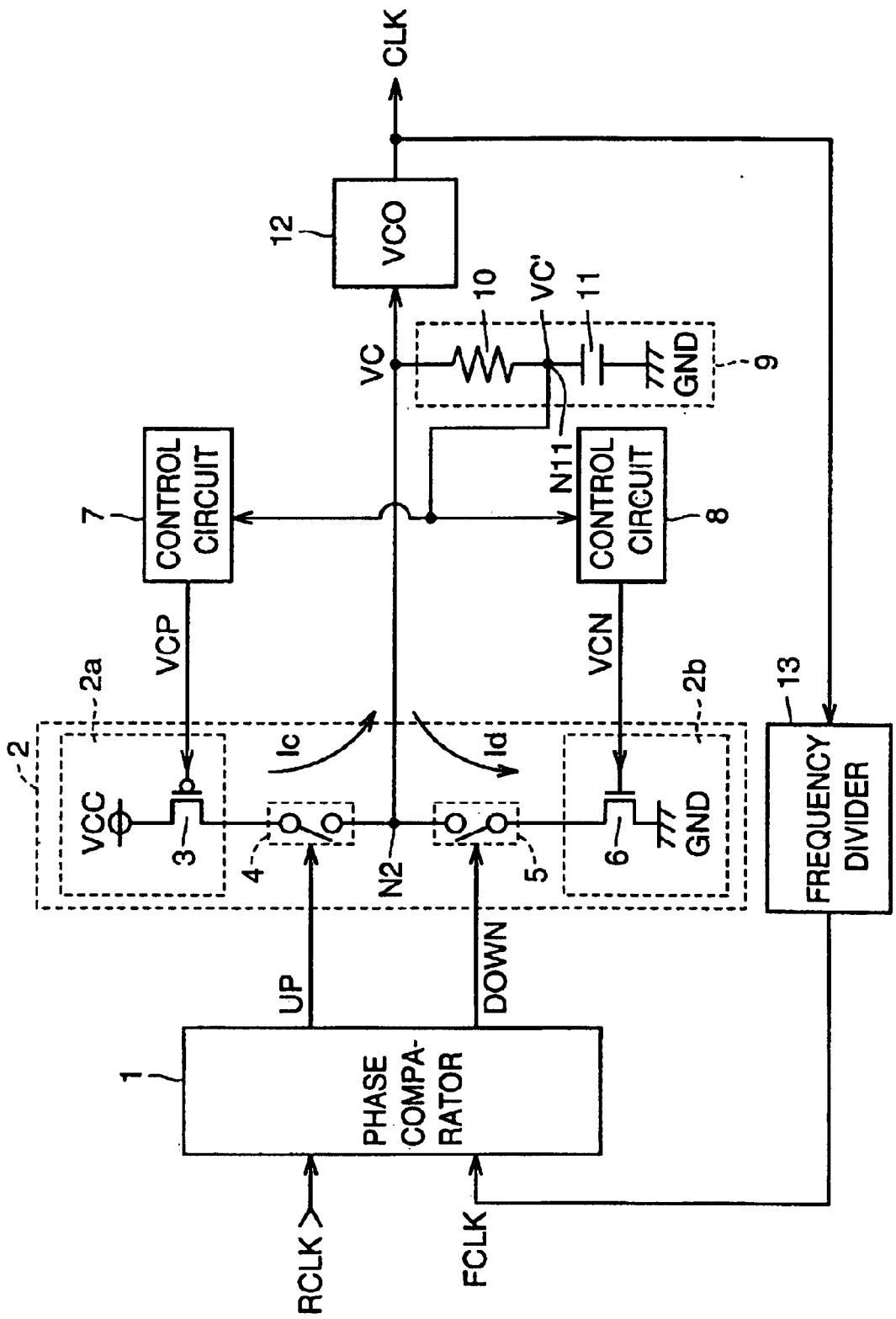
FIG. 8 is a circuit block diagram showing another modification of the first embodiment.

In the modification shown in FIG. 8, control circuits 7, 8 generate control potentials VCP, VCN in accordance with a potential VC of a node N11 between resistance element 10 and capacitor 11 of loop filter 9. Potential VC of node N11 is more stable than potential VC of node N2, so that more stable control of MOS transistors 3, 6 can be achieved.

Figure 9:
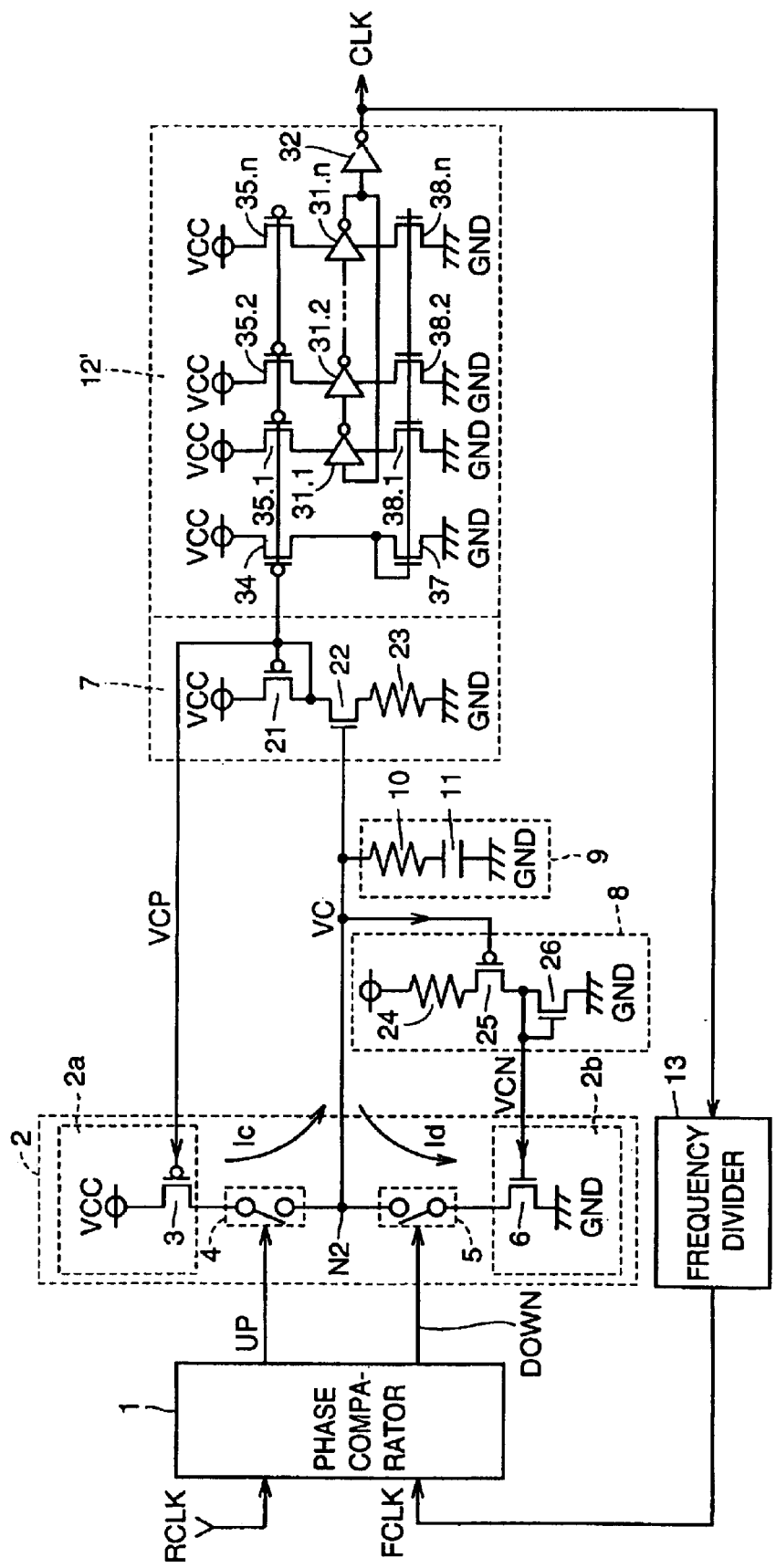
FIG. 9 is a circuit block diagram showing a further modification of the first embodiment.

Control circuit 7 shown in FIG. 5 has the same configuration as that of the portion constituted by P-channel MOS transistor 33, N-channel MOS transistor 36 and resistance element 39 of VCO 12 shown in FIG. 6. Therefore, in the modification shown in FIG. 9, MOS transistors 33, 36 and resistance element 39 in VCO 12 are omitted, and control potential VCP generated at control circuit 7 is applied to the gates of P-channel MOS transistors 34, 35.1 to 35.n in VCO 12. In this modification, in addition to attainment of the same effect as that of the PLL circuit in FIG. 1, the layout area can be reduced by the area that would be occupied by MOS transistors 33, 36 and resistant element 29.

Figure 10:
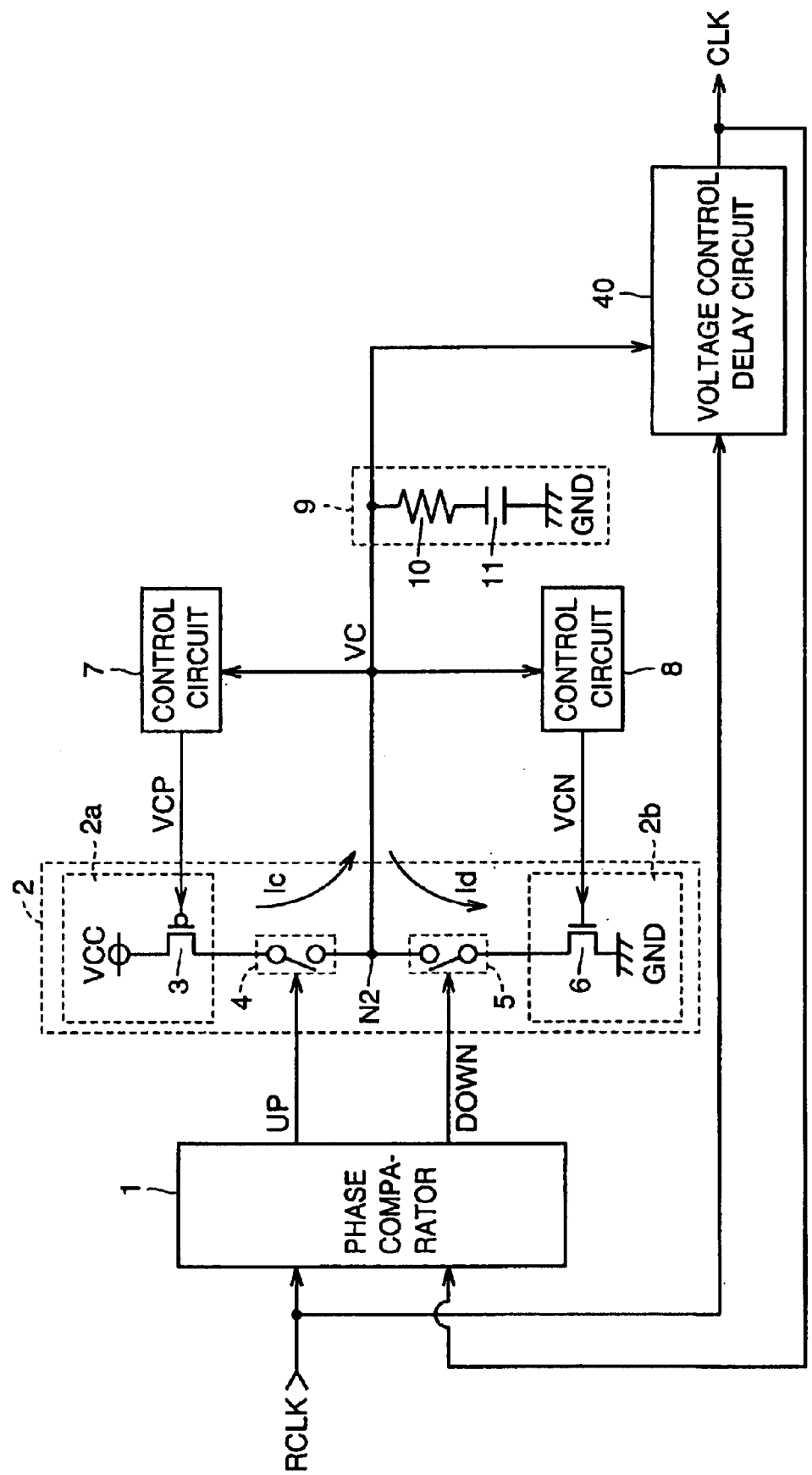
FIG. 10 is a circuit diagram showing a yet another modification of the first embodiment.

Moreover, though in FIGS. 1 to 9, the case where the present invention is applied to the PLL circuit was described, the present invention is applicable to other clock synchronizers such as DLL (Delay Locked Loop) circuit. FIG. 10 is a circuit block diagram showing the configuration of a DLL circuit to which the present invention is applied. In FIG. 10, the DLL circuit is different from the PLL circuit in FIG. 1 in that VCO 12 and frequency divider 13 are replaced by a voltage control delay circuit 40. Voltage control delay circuit 40 delays reference clock signal RCLK by a time period corresponding to control voltage VC, to generate an internal clock signal CLK. Internal clock signal CLK is returned to phase comparator 1. Generation of an offset is prevented also in this modification.

Second Embodiment

In FIG. 5, if, for some reason, node N2 has power-supply potential VCC, current Ic flowing through P-channel MOS transistor 3 at the time of conduction of switching element 4 will be at the maximal value, while no current Id flows through N-channel MOS transistor 6 even though switching element 5 is rendered conductive. Furthermore, if node 2 has ground potential GND for some reason, current Id flowing through N-channel MOS transistor 6 at the time of conduction of switching element 5 will be at the maximal value, while no current Ic flows through P-channel MOS transistor 3 even though switching element 4 is rendered conductive. Therefore, when node N2 has power-potential VCC or ground potential GND, the PLL circuit of the first embodiment will be inoperative. This problem is solved in the second embodiment.

Figure 11:
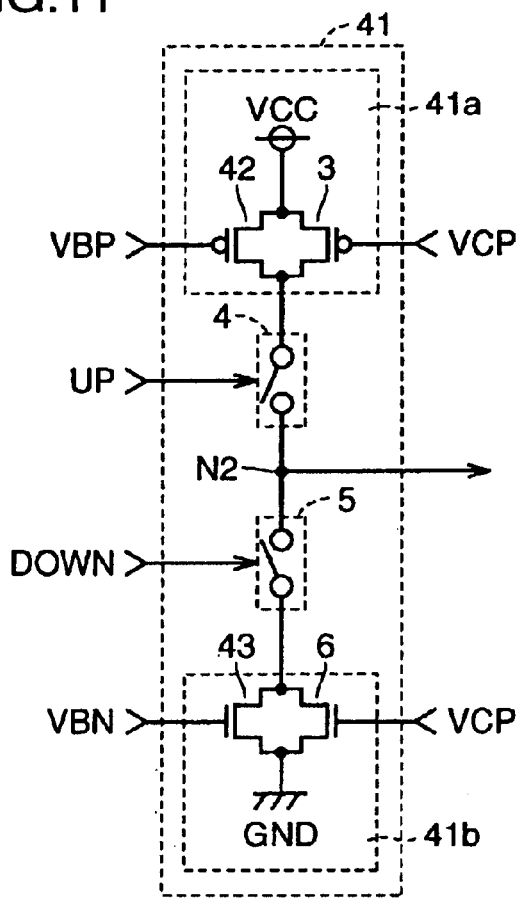
FIG. 11 is a circuit diagram showing the configuration of a charge pump circuit included in a PLL circuit according to the second embodiment of the present invention.

FIG. 11 is a circuit diagram showing a substantial part of a PLL circuit according to the second embodiment of the present invention. In FIG. 11, this PLL circuit is different from the PLL circuit in FIG. 1 in that charge pump circuit 2 is replaced by a charge pump circuit 41.

Figure 12:
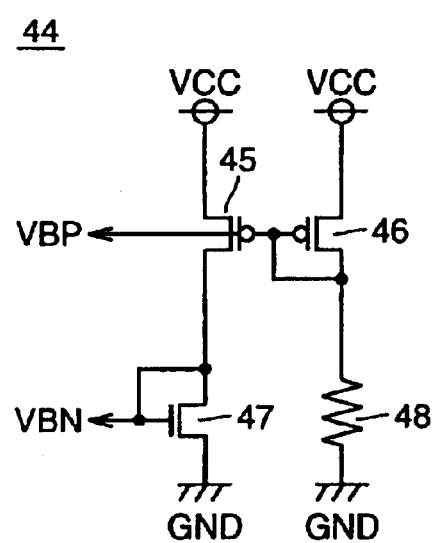
FIG. 12 is a circuit diagram showing the configuration of a bias generating circuit for generating a bias potential shown in FIG. 11.

Charge pump circuit 41 includes MOS transistors 42, 43 connected respectively in parallel with P-channel MOS transistors 3, 6 of charge pump circuit 2. The gate of P-channel MOS transistor 42 receives a constant bias potential VBP, and the gate of N-channel MOS transistor 43 receives a constant bias potential VBN. P-channel MOS transistors 3, 42 constitute a variable current source 41a, and N-channel MOS transistors 6, 43 constitute a variable current source 41b. FIG. 12 is a circuit diagram showing the configuration of a bias potential generating circuit 44 generating bias potentials VBP, VBN. In FIG. 12, bias potential generating circuit 44 includes P-channel MOS transistors 45, 46, N-channel MOS transistor 47, and a resistance element 48.

MOS transistors 45 and 47, and P-channel MOS transistor 46 and resistance element 48 are respectively connected in series between the lines of power-supply potentials VCC and the lines of ground potentials GND. The gates of P-channel MOS transistors 45, 46 are both connected to the drain of P-channel MOS transistor 46. P-channel MOS transistors 45, 46 constitute a current mirror circuit. The gate potentials of P-channel MOS transistors 45, 46 are to be bias potential VBP. The gate of N-channel MOS transistor 47 is connected to the drain thereof. The gate potential of N-channel MOS transistor 47 is to be bias potential VBN.

Constant current determined by the resistance value of resistance element 48 and power-supply voltage VCC flows through P-channel MOS transistor 46 and resistance element 48. P-channel MOS transistors 45, 46 constitute a current mirror circuit and MOS transistors 45, 47 are serially connected, so that constant current of a value according to the current flowing through P-channel MOS transistor 46 and resistance element 48 flows through MOS transistors 45, 47. Furthermore, the gate of P-channel MOS transistor 42 of charge pump circuit 41 is connected to the gates of P-channel MOS transistors 45, 46, and the gate of N-channel MOS transistor 43 of charge pump circuit 41 is connected to the gate of N-channel MOS transistor 47, so that constant current of a value according to the current flowing through P-channel MOS transistor 46 and resistance element 48 flows through MOS transistors 42, 43.

Therefore, in the second embodiment, even when node N2 has power-supply potential VCC and thus no current flows through N-channel MOS transistor 6, current flows through N-channel MOS transistor 43, so that the PLL circuit operates. Moreover, even when node N2 has ground potential GND and thus no current flows through P-channel MOS transistor 3, current flows through P-channel MOS transistor 42, so that the PLL circuit still operates. The other configurations and operations are the same as those of the PLL circuit in FIG. 1, so that the description thereof will not be repeated.

Third Embodiment

Figure 13:
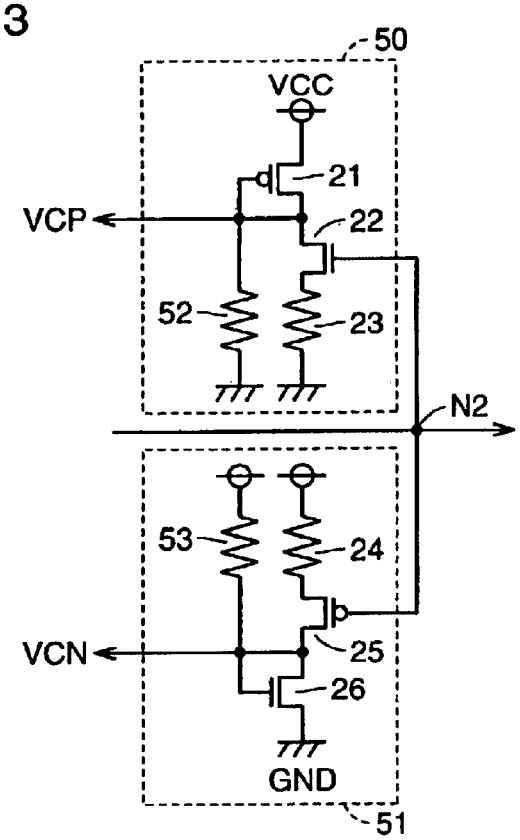
FIG. 13 is a circuit diagram showing the configuration of a control circuit included in a PLL circuit according to the third embodiment of the present invention.

FIG. 13 is a circuit diagram showing a substantial part of a PLL circuit according to the third embodiment of the present invention. In FIG. 13, this PLL circuit is different from the PLL circuit in FIG. 1 in that control circuits 7, 8 are replaced by control circuits 50, 51, respectively.

Control circuit 50 includes a resistance element 52 connected in parallel with N-channel MOS transistor 22 and resistance element 23 of control circuit 7 shown in FIG. 5. Control circuit 51 includes a resistance element 53 connected in parallel with resistance element 24 and P-channel MOS transistor 25 of control circuit 8 shown in FIG. 5.

Therefore, in the third embodiment, even when node N2 has power-supply potential VCC and thus no current flows through P-channel MOS transistor 25, current flows through resistance element 53 and N-channel MOS transistor 26 and current flows through N-channel MOS transistor 6 of the charge pump circuit, so that the PLL circuit operates. Moreover, even when node N2 has power-supply potential VCC and thus no current flows through N-channel MOS transistor 22, current flows through P-channel MOS transistor 21 and resistance element 52 and current flows through P-channel MOS transistor 3 of charge pump circuit 2, so that the PLL circuit operates. . The other configurations and operations are the same as those of the PLL circuit in FIG. 1, so that the description thereof will not be repeated.

Fourth Embodiment

Figure 23:
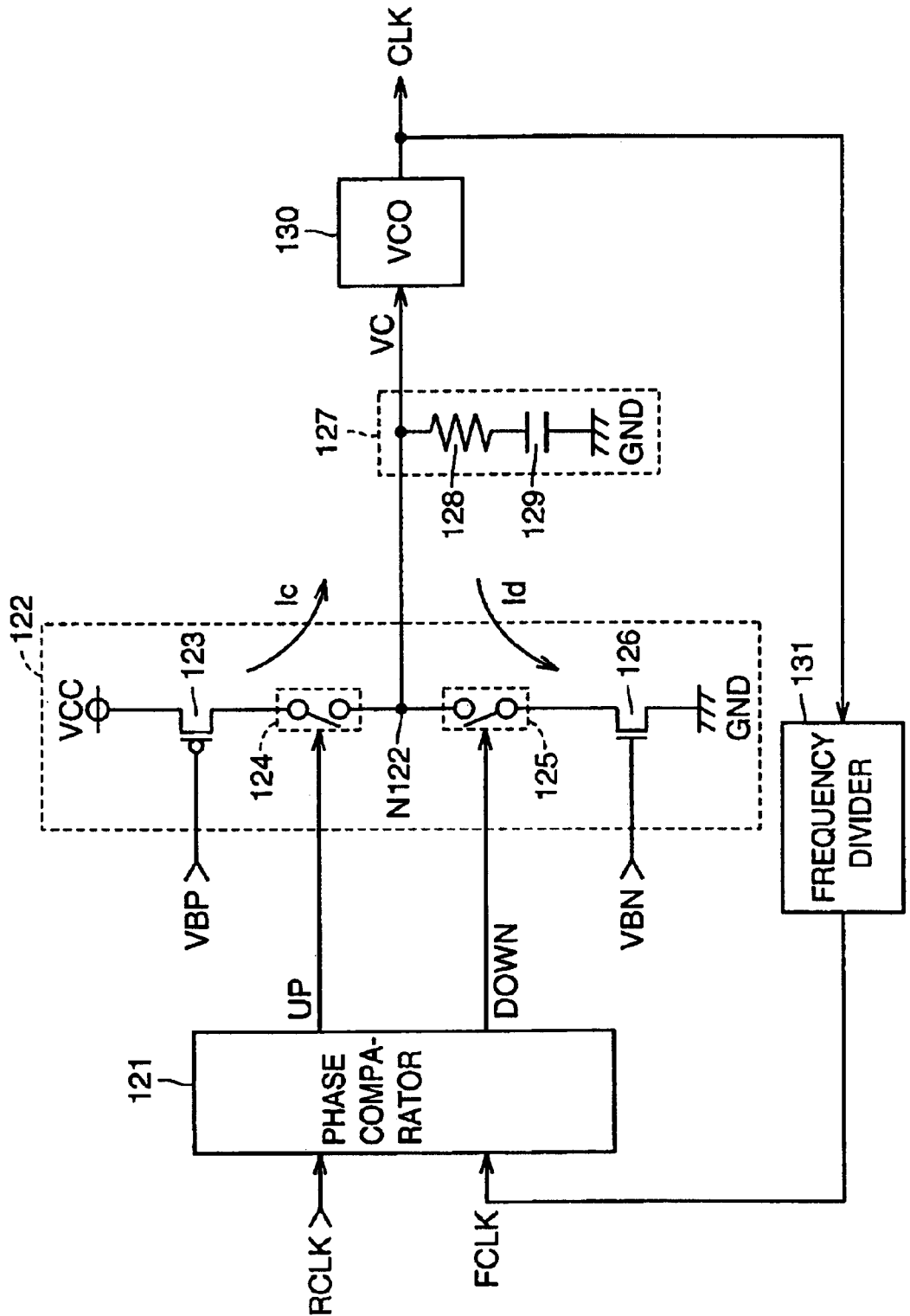
FIG. 23 is a circuit block diagram showing the configuration of the conventional PLL circuit.

In the conventional PLL circuit shown in FIG. 23, assuming that potential VC of node N122 is ground potential GND before the power-supply is turned on, and potential VC of node N122 in the locked state is VCC/2, current Ic flowing through P-channel MOS transistor 123 supplies charge to node N122 for a period from the power-up until the locked state is reached. Current Ic at this moment is increased as potential VC of node N122 is lowered. Thus, in the conventional PLL circuit, while there is a disadvantage in that current Ic and Id disagree with each other generating an offset, there is an advantage in that the time period from the power-up to the locked state is short.

Whereas, in the PLL circuit of FIG. 1, current Ic, Id are controlled to be constant irrespective of potential VC of node N2. Therefore, in the PLL circuit of FIG. 1, while there is an advantage in that no offset occurs even though potential VC of node N2 is varied, there is a disadvantage in that the time period from the power power-up to the locked state is longer than that of the conventional case. This problem is solved in the fourth embodiment.

Figure 14:
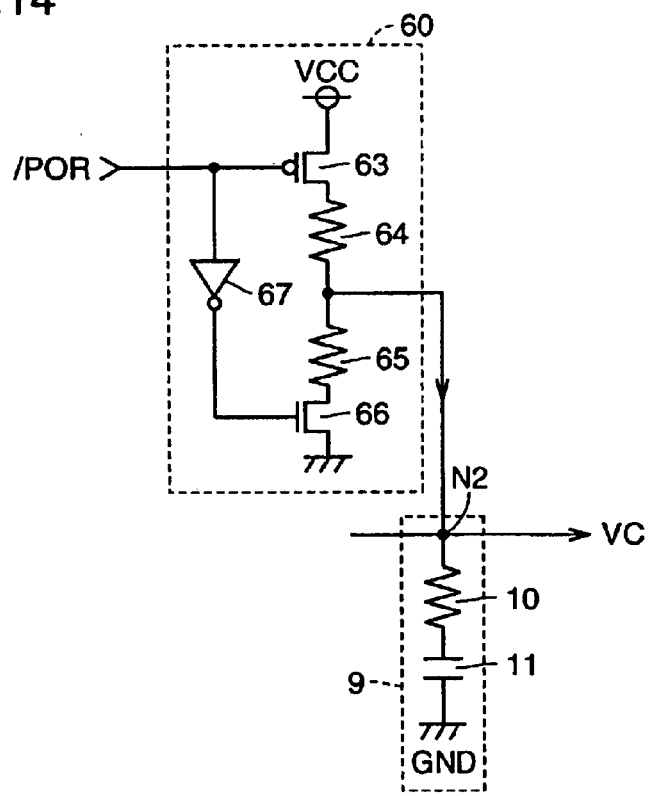
FIG. 14 is a circuit diagram showing the configuration of a precharge circuit included in a PLL circuit according to the fourth embodiment of the present invention.

FIG. 14 is a circuit diagram showing a substantial part of a PLL circuit according to the fourth embodiment of the present invention. In FIG. 14, this PLL circuit is different from the PLL circuit of FIG. 1 in that a precharge circuit 60 is added.

Precharge circuit 60 includes a P-channel MOS transistor 63, a resistance elements 64, 65 and an N-channel MOS transistor 66 connected in series between the line of power-supply potential VCC and the line of ground potential GND, and an inverter 67. A power-on reset signal/POR is input directly into the gate of P-channel MOS transistor 63, and also is input into the gate of N-channel MOS transistor 66 via inverter 67. Signal /POR is a signal set to be at an activated level of "L" level, for a predetermined period of time from the power-up. A node between resistance elements 64 and 65 is connected to node N2. Resistance elements 64 and 65 have the same resistance value.

Before the power is turned on, node N2 is assumed to have ground potential GND. When the power is turned on and signal /POR is lowered to the activated level of "L" level, MOS transistors 63, 66 are rendered conductive, and potential VC of node N2 attains to potential VCC/2 obtained by dividing power-supply voltage VCC by resistance elements 64 and 65.

Therefore, in the fourth embodiment, potential VC of node N2 can be raised rapidly at power-up, and therefore the time period from the power-up to the locked state is shortened.

It is noted that, though resistance elements 64 and 65 have the same resistance value in the fourth embodiment, the ratio of the resistance values of resistance elements 64 and 65 may be changed to precharge potential VC of node N2 to be at a desired potential.

Fifth Embodiment

Figure 15:
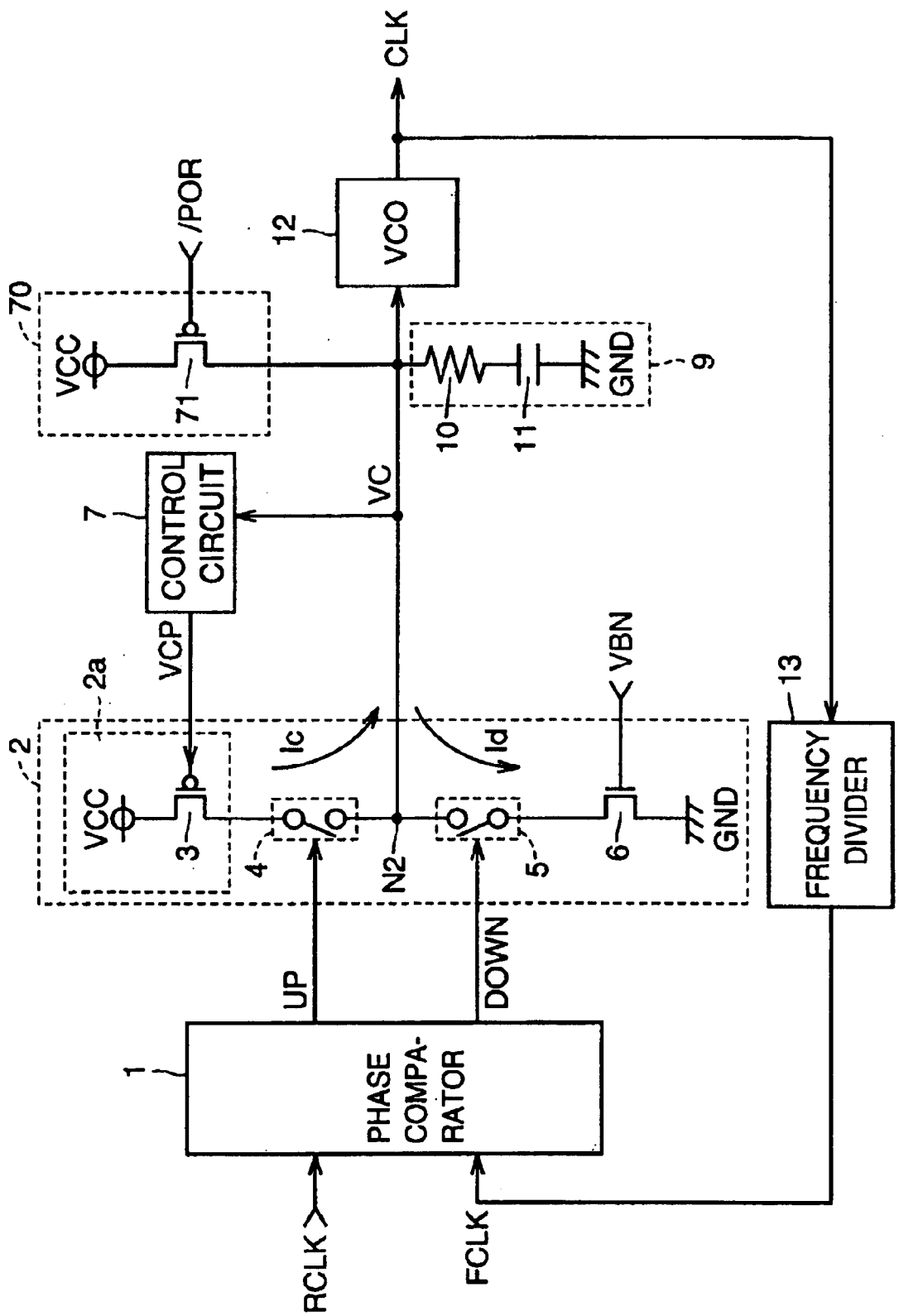
FIG. 15 is a circuit block diagram showing the configuration of a PLL circuit according to the fifth embodiment of the present invention.

FIG. 15 is a circuit block diagram showing the configuration of a PLL circuit according to the fifth embodiment of the present invention. Referring to FIG. 15, this PLL circuit is different from the PLL circuit in FIG. 1 in that control circuit 8 is removed and a constant bias potential VBN is applied to the gate of N-channel MOS transistor 6, and in that a precharge circuit 70 is added. Precharge circuit 70 includes a P-channel MOS transistor 71. P-channel MOS transistor 71 is connected between the line of power-supply potential VCC and node N2, and the gate thereof receives a power-on reset signal/POR.

Before the power is turned on, node N2 is assumed to have ground potential GND. When the power is turned on and signal/POR is lowered to an activated level of "L" level for a certain period of time, P-channel MOS transistor 71 conducts in a pulsive manner and node N2 is precharged to be at power-supply potential VCC. N-channel MOS transistor 6 in charge pump circuit 2 passes larger current therethrough as potential VC of node N2 becomes higher. Therefore, compared to the PLL circuit in FIG. 1 where current Ic flowing through N-channel MOS transistor 6 was made constant irrespective of the level of potential VC of node N2, the time period from the power-up until the potential of node N2 reaches the potential at lock-in can be shorter.

Moreover, current flowing through P-channel MOS transistor 3 is made constant by control circuit 7, so that occurrence of an offset can be inhibited compared to the conventional case where current Ic flowing through P-channel MOS transistor 3 was reduced/increased as current Id flowing through N-channel MOS transistor 6 was increased/decreased.

Sixth Embodiment

Figure 16:
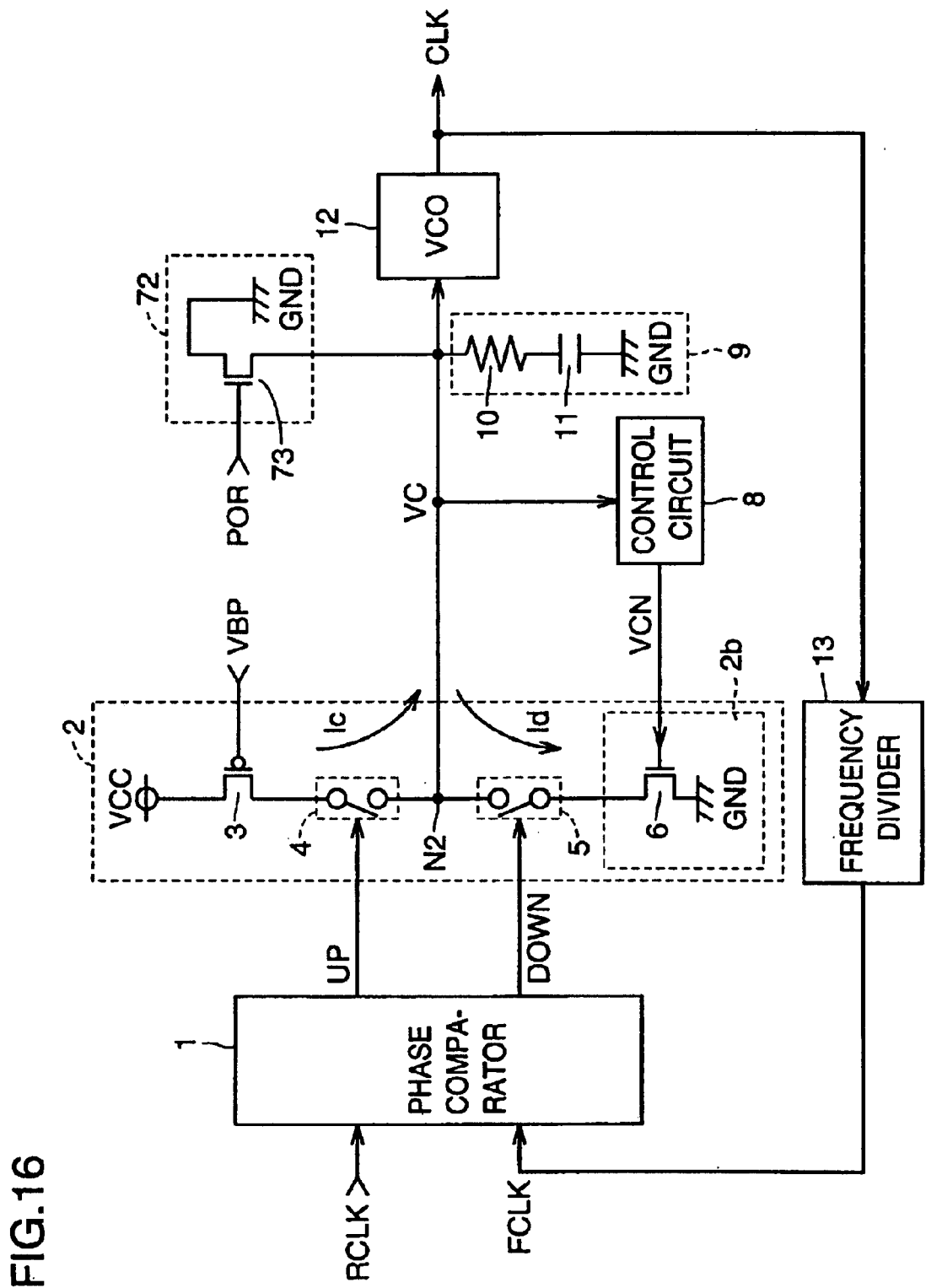
FIG. 16 is a circuit block diagram showing the configuration of a PLL circuit according to the sixth embodiment of the present invention.

FIG. 16 is a circuit block diagram showing the configuration of a PLL circuit according to the sixth embodiment of the present invention. Referring to FIG. 16, this PLL circuit is different from the PLL circuit of FIG. 1 in that control circuit 7 is removed and a constant bias potential VBP is applied to the gate of P-channel MOS transistor 3, and that a predischarge circuit 72 is added. Predischarge circuit 72 includes an N-channel MOS transistor 73. N-channel MOS transistor 73 is connected between node N2 and the line of ground potential GND, and the gate thereof receives a complementary signal POR of the power-on reset signal.

It is assumed that node N2 has an arbitrary potential before the power is turned on. When the power is turned on and signal POR is raised to an activated level of "H" level for a certain period of time, N-channel MOS transistor 73 conducts in a pulsive manner and node N2 is predischarged to be at ground potential GND. P-channel MOS transistor 3 in charge pump circuit 2 passes larger current therethrough as potential VC of node N2 is lowered. Therefore, compared to the PLL circuit of FIG. 1 where current Id flowing through P-channel MOS transistor 3 was made constant irrespective of the level of potential VC of node N2, the time period from the power-up until the potential of node N2 reaches the potential at lock-in can be shorter.

Furthermore, current flowing through N-channel MOS transistor 6 is made constant by control circuit 8, so that occurrence of an offset can be inhibited compared to the conventional case where current Id flowing through N-channel MOS transistor 6 was reduced/increased as current Ic flowing through P-channel MOS transistor 3 was increased/reduced.

Seventh Embodiment

Figure 17:
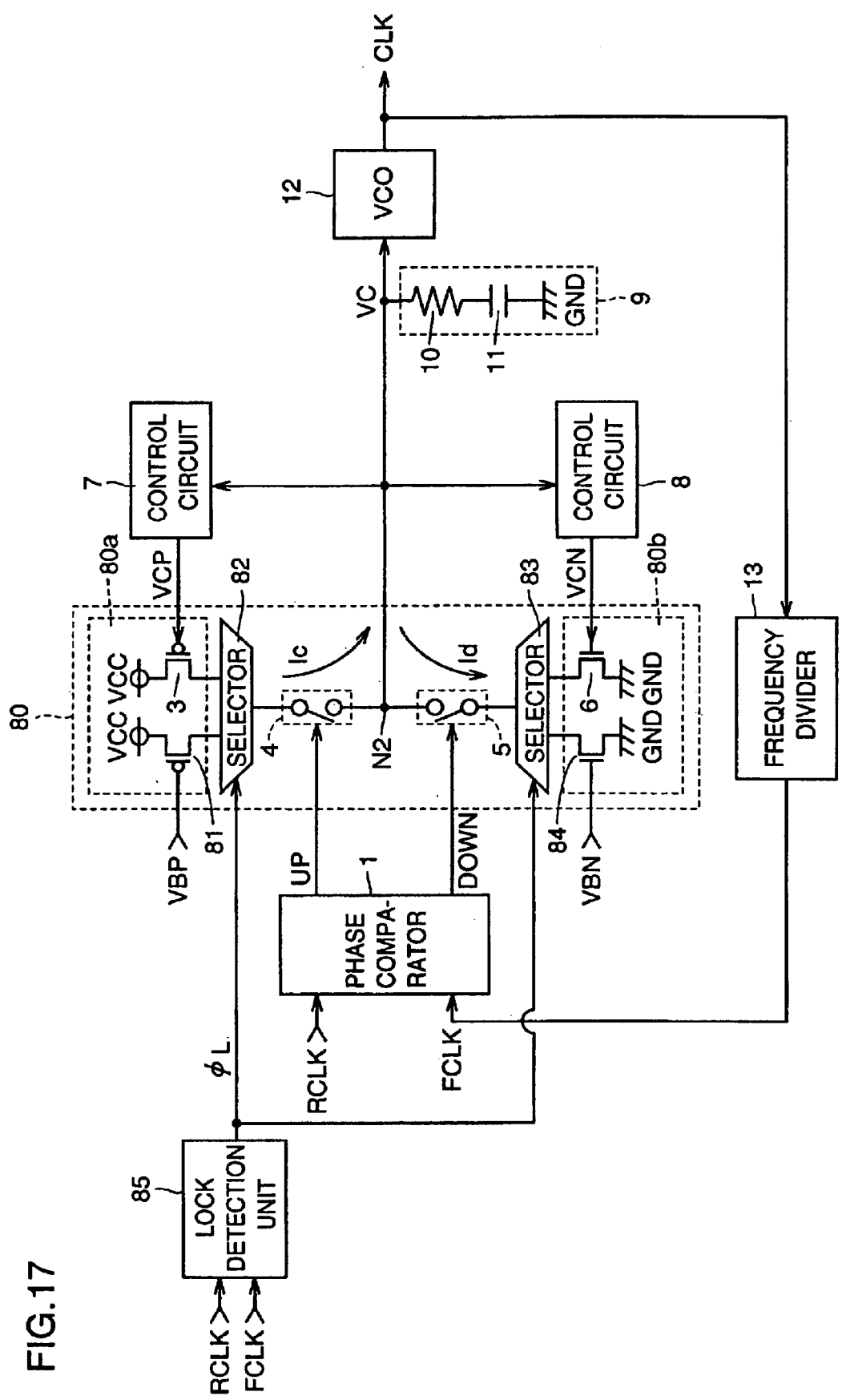
FIG. 17 is a circuit block diagram showing the configuration of a PLL circuit according to the seventh embodiment of the present invention.

FIG. 17 is a circuit block diagram showing the configuration of an PLL circuit according to the seventh embodiment of the present invention. Referring to FIG. 17, this PLL circuit is different from the PLL circuit of FIG. 1 in that charge pump circuit 2 is replaced by a charge pump circuit 80, and that a lock detector 85 is added.

Lock detector 85 sets a lock detection signal φL at an activated level of "H" level when the phase difference between reference clock signal RCLK and feedback clock signal FCLK is smaller than a predetermined level, whereas it sets lock detection signal φL at an inactivated level of "L" level when the phase difference between reference clock signal RCLK and feedback clock signal FCLK is larger than the predetermined level.

Charge pump circuit 80 is different from charge pump circuit 2 in that a P-channel MOS transistor 81, an N-channel MOS transistor 84, and selectors 82, 83 are added.

The source of P-channel MOS transistor 81 receives power-supply potential VCC, and the gate thereof receives a constant bias potential VBP. P-channel MOS transistors 3, 81 constitute a variable current source 80a. Selector 82 is interposed between the drains of P-channel MOS transistors 3, 81 and one electrode of switching element 4, to connect the drain of P-channel MOS transistor 81 to the one electrode of switching element 4 when signal φL is at the inactivated level of "L" level, and to connect the drain of P-channel MOS transistor 3 to the one electrode of switching element 4 when signal φL is at the activated level of "H" level.

The source of N-channel MOS transistor 84 receives ground potential GND, and the gate thereof receives a constant bias potential VBN. N-channel MOS transistors 6, 84 constitute a variable current source 80b. Selector 83 is interposed between the drains of N-channel MOS transistors 6, 84 and one electrode of switching element 5, to connect the drain of N-channel MOS transistor 84 to the one electrode of switching element 5 when signal φL is at the inactivated level of "L" level, and to connect the drain of N-channel MOS transistor 6 to the one electrode of switching element 5 when signal φL is at the activated level of "H" level.

Next, the operation of this PLL circuit will be described. When the PLL circuit has not reached the locked state such as at power-up, signal φL is lowered to the inactivated level of "L" level, and the drain of P-channel MOS transistor 81 is connected to the one electrode of switching element 4 by selector 82, while the drain of N-channel MOS transistor 84 is connected to the one electrode of switching element 5 by selector 83. In this case, the PLL circuit in FIG. 17 has the same configuration as that of the conventional PLL circuit. Therefore, as in the conventional case, this PLL circuit rapidly reaches the locked state. However, an offset occurs in this state.

When the PLL circuit reaches the locked state, signal φL is raised to the activated level of "H" level, and the drain of P-channel MOS transistor 3 is connected to the one electrode of switching element 4 by selector 82, while the drain of N-channel MOS transistor 6 is connected to the one electrode of switching element 5 by selector 83. In this case, the PLL circuit in FIG. 17 has the same configuration as that of the PLL circuit in FIG. 1. Therefore, no offset occurs even though control potential VC at lock-in is varied.

Eighth Embodiment

Figure 18:
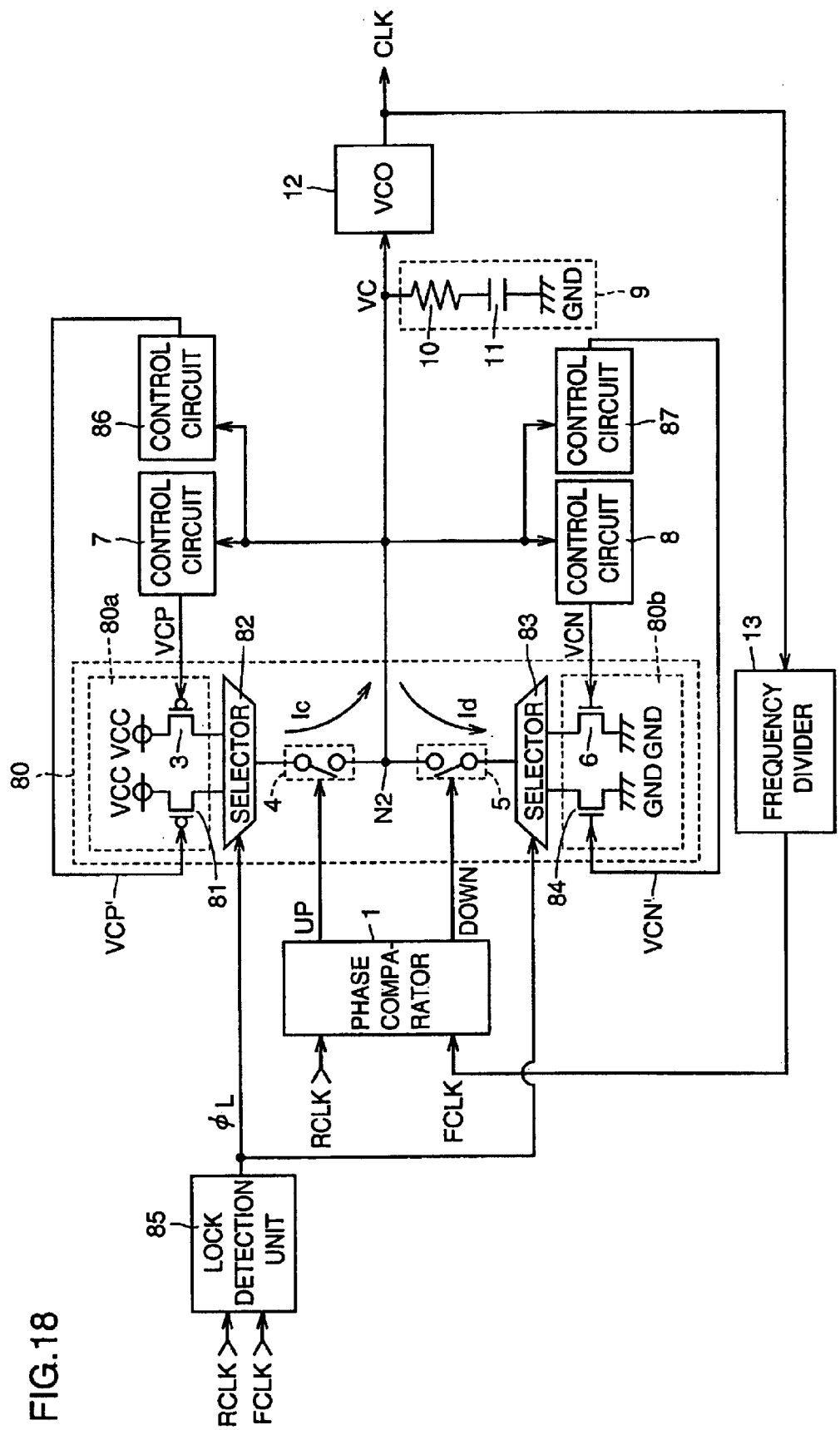
FIG. 18 is a circuit block diagram showing the configuration of a PLL circuit according to the eighth embodiment of the present invention.

FIG. 18 is a circuit block diagram showing the configuration of a PLL circuit according to the eighth embodiment of the present invention. In FIG. 18, this PLL circuit is different from the PLL circuit in FIG. 17 in that control circuits 86, 87 are added and control potentials VCP', VCN' generated at control circuits 86, 87 are input into the gates of MOS transistors 81, 84 in place of bias potentials VBP, VBN.

Figure 19:
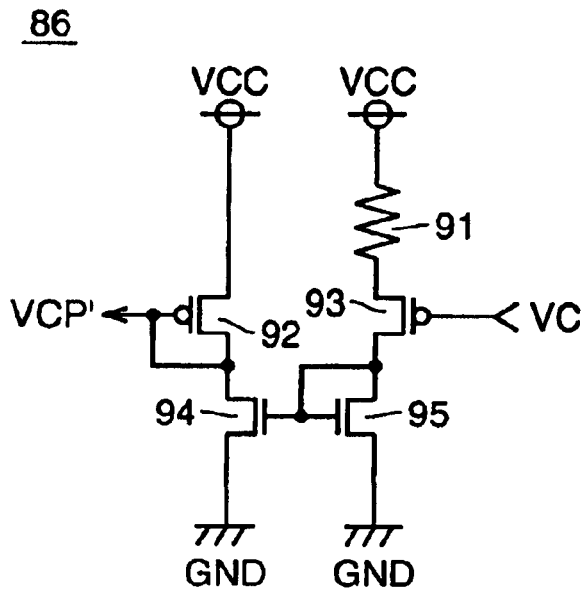
FIG. 19 is a circuit diagram showing the configuration of a control circuit 86 shown in FIG. 18.

Control circuit 86 includes, as shown in FIG. 19, a resistance element 91, P-channel MOS transistors 92, 93, and N-channel MOS transistors 94, 95. MOS transistors 92 and 94, and resistance element 91 and MOS transistors 93, 95 are respectively connected in series between the lines of power-supply potential VCC and the lines of ground potential GND. The gate of P-channel MOS transistor 93 receives a control potential VC. The gates of N-channel MOS transistors, 94, 95 are both connected to the drain of N-channel MOS transistor 95. N-channel MOS transistors 94 and 95 constitute a current mirror circuit. The gate of P-channel MOS transistor 92 is connected to the drain thereof. The gate potential of P-channel MOS transistor 92 is to be control potential VCP'.

MOS transistors 94, 95 constitute the current mirror circuit, MOS transistors 92 and 94 are connected in series, and the gate of P-channel MOS transistor 29 is connected to the gate of P-channel MOS transistor 81 in charge pump circuit 80, so that current corresponding to the current flowing through P-channel MOS transistor 97 flows through P-channel MOS transistor 81.

When control potential VC is made higher, the resistance value of P-channel MOS transistor 93 is increased, reducing current flowing through resistance element 91 and MOS transistors 93, 95, and current flowing through P-channel MOS transistor 81 is also reduced. When control potential VC is lowered, the resistance value of P-channel MOS transistor 93 is reduced, increasing current flowing through resistance element 91 and MOS transistors 93, 95, and current flowing through P-channel MOS transistor 81 is also increased.

Figure 20:
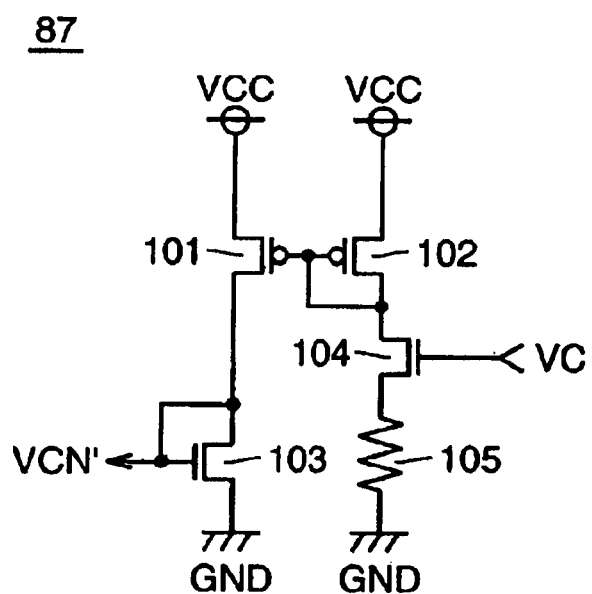
FIG. 20 is a circuit diagram showing the configuration of a control circuit 87 shown in FIG. 18.

In control circuit 87, as shown in FIG. 20, MOS transistors 101, 103, and MOS transistors 102, 104 and resistance element 105 are respectively connected in series between the lines of power-supply potential VCC and the lines of ground potential GND. The gate of N-channel MOS transistor 104 receives control potential VC. The gates of P-channel MOS transistors 101, 102 are both connected to the drain of P-channel MOS transistor 102. P-channel MOS transistors 101 and 102 constitute a current mirror circuit. The gate of N-channel MOS transistor 103 is connected to the drain thereof The gate potential of N-channel MOS transistor 103 is to be control potential VCN'.

N-channel MOS transistors 101 and 102 constitute a current mirror circuit, MOS transistors 101, 103 are connected in series, and the gate of N-channel MOS transistor 103 is connected to the gate of N-channel MOS transistor 84 of charge pump circuit 80, so that current of a value corresponding to the current flowing through N-channel MOS transistor 104 flows through N-channel MOS transistor 84.

As control potential VC is increased, the resistance value of N-channel MOS transistor 104 is lowered, increasing the current flowing through MOS transistors 102, 104 and resistance element 105, and the current flowing through N-channel MOS transistor 84 is also increased. As control potential VC is lowered, the resistance value of N-channel MOS transistor 104 is lowered, reducing the current flowing through MOS transistors 102, 104 and resistance element 105, and current flowing through N-channel MOS transistor 84 is also reduced.

Next, the operation of the PLL circuit will be described. When the PLL circuit is not in the locked state, signal φL is set to be at the inactivated level of "L" level, and the drain of P-channel MOS transistor 81 is connected to one electrode of switching element 4 by selector 82, while the drain of N-channel MOS transistor 84 is connected to one electrode of switching element 5 by selector 83.

When control potential VC is lower than VCC/2, control potential VCP' is lowered and the current flowing through P-channel MOS transistor 81 is increased, while control potential VCN' is lowered and the current flowing through N-channel MOS transistor 84 is reduced.

When control potential VC is higher than VCC/2, control potential VCP' is increased and the current flowing through P-channel MOS transistor 81 is reduced, while control potential VCN' is increased and the current flowing through N-channel MOS transistor 84 is increased.

Therefore, the locked state can be reached in a shorter time period compared to the case with the PLL circuit in FIG. 17 in which the constant bias potential was applied to the gates of MOS transistors 81, 84. The other configurations and operations are the same as those of the PLL circuit in FIG. 17, so that the description thereof will not be repeated.

Ninth Embodiment

Figure 21:
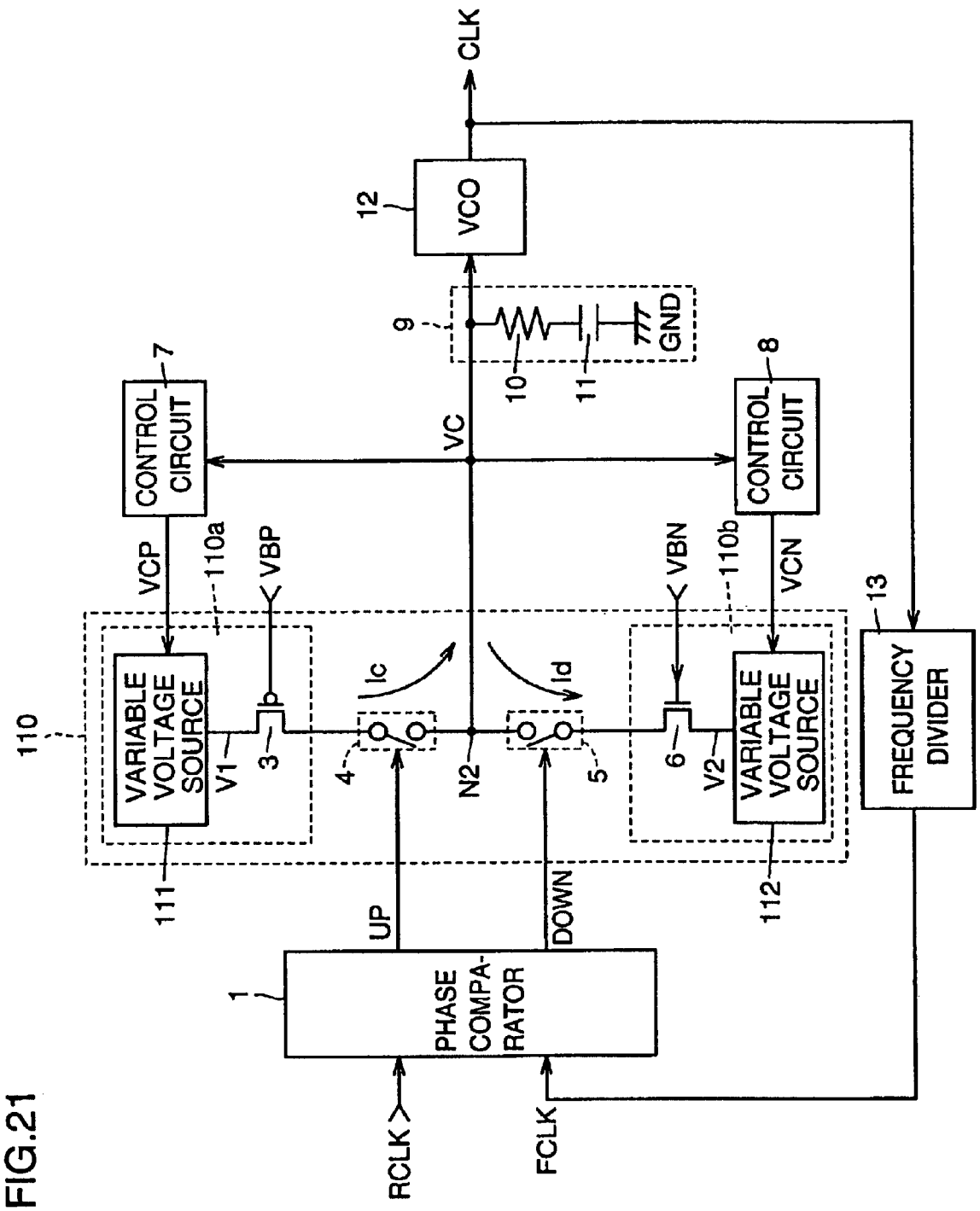
FIG. 21 is a circuit block diagram showing the configuration of a PLL circuit according to the ninth embodiment of the present invention.

FIG. 21 is a circuit block diagram showing the configuration of a PLL circuit according to the ninth embodiment of the present invention. In FIG. 21, this PLL circuit is different from the PLL circuit in FIG. 1 in that charge pump circuit 2 is replaced by a charge pump circuit 110. Charge pump circuit 110 is different from charge pump circuit 2 in that, in place of control potentials VCP, VCN, constant bias potentials VBP, VBN are applied, respectively, to the gates of MOS transistors 3, 6, and that, in place of power-supply potential VCC and ground potential GND, output potentials V1, V2 of variable voltage sources 111, 112 are applied, respectively, to the sources of MOS transistors 3, 6.

Variable voltage sources 111, 112 are controlled by control circuits 7, 8, respectively. Variable voltage source 111 and P-channel MOS transistor 3 constitute a variable current source 110*a*, and variable voltage source 112 and N-channel MOS transistor 6 constitute a variable current source 110*b*.

As control potential VC is increased, output potentials V1, V2 of variable voltage sources 110, 111 are also increased, and as control potential VC is lowered, output potentials V1, V2 of variable voltage sources 110, 111 are also lowered, and thus V1-VC and VC-V2 are always maintained to be constant. Therefore, even though control potential VC is varied, current Ic flowing through P-channel MOS transistor 3 at the time of conduction of switching element 4 and current Id flowing through N-channel MOS transistor 6 at the time of conduction of switching element 5 are always maintained to be constant, so that no offset occurs.

Tenth Embodiment

Figure 22:
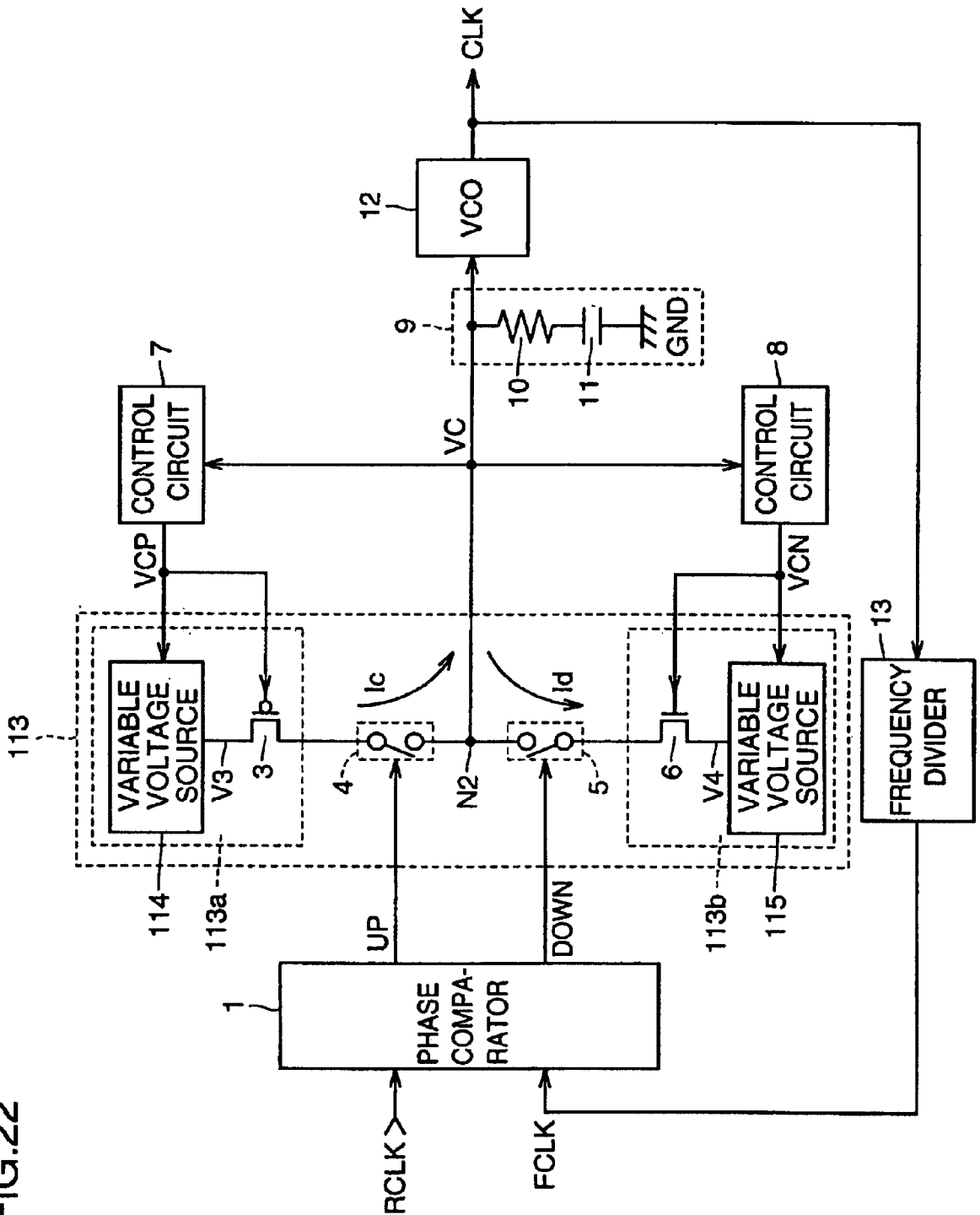
FIG. 22 is a circuit block diagram showing the configuration of a PLL circuit according to the tenth embodiment of the present invention.

FIG. 22 is a circuit diagram showing the configuration of a PLL circuit according to the tenth embodiment of the present invention. In FIG. 22, this PLL circuit is different from the PLL circuit in FIG. 1 in that charge pump circuit 2 is replaced by a charge pump circuit 113.

Charge pump circuit 113 is different from charge pump circuit 2 in that, in place of power-supply potential VCC and ground potential GND, output potentials V3, V4 of variable voltage sources 114, 115 are applied, respectively, to the sources of MOS transistors 3, 6. Variable voltage sources 114, 115 are controlled by control circuits 7, 8, respectively. Variable voltage source 114 and P-channel MOS transistor 3 constitute a variable current source 113*a*, and variable voltage source 115 and N-channel MOS transistor 6 constitute a variable current source 113*b*.

Variable voltage source 114 performs fine adjustment of source potential V3 of P-channel MOS transistor 3 so as to maintain current Ic flowing through P-channel MOS transistor 3 at conduction of switching element 4 to be at a constant value, irrespective of control potential VC. Variable voltage source 115 performs fine adjustment of source potential V4 of N-channel MOS transistor 6 so as to maintain current Id flowing through N-channel MOS transistor 6 at conduction of switching element 5 to be at a constant value, irrespective of control potential VC. Therefore, current Ic, Id can be maintained at a constant value more precisely than the case with the PLL circuit in FIG. 1, so that occurrence of an offset can reliably be prevented.

It is noted that, though, P-channel MOS transistor 3 and N-channel MOS transistor 6 constitute variable current sources 2*a*, 2*b*, respectively, in the first embodiment, and variable voltage source 111 and P-channel MOS transistor 3, and variable voltage source 112 and N-channel MOS transistor 6 constitute variable current sources 110*a*, 110*b*, respectively, in the ninth embodiment, and further, current voltage source 114 and P-channel MOS transistor 3, and variable voltage source 115 and N-channel MOS transistor 6 constitute variable current sources 113*a*, 113*b*, respectively, in the tenth embodiment, the variable current source is not limited thereto, and may have any configuration in which output current can be controlled.

The embodiments disclosed herein should be considered in all terms as illustrative, not limitative. The scope of the present invention is defined only by the attached claims, not by the description above, and is intended to encompass all modifications within the meaning and scope of the claims and equivalents.

What is claimed is:

1. A clock synchronizer generating a second clock signal synchronized with a first clock signal, comprising:

a phase difference detection circuit for detecting a phase difference between said first and second clock signals, and setting a first control signal to be at an activated level for a time period corresponding to the phase difference;

a loop filter connected to a predetermined node;

a current-supply circuit for supplying current to said loop filter in response to the first control signal from said phase difference detection circuit; and a clock generating circuit for generating said second clock signal in accordance with a potential of said predetermined node; wherein said current-supply circuit includes a variable current source whose output current can be controlled, a first switching circuit for passing output current of said variable current source through said loop filter in response to that said first control signal is set to be at the activated level, and a first control circuit for controlling said variable current source such that predetermined constant current flows from said variable current source to said loop filter, based on the potential of said predetermined node, wherein:

said variable current source includes a first transistor of a first conductivity type whose input electrode receives a first control potential, said first switching circuit connects said first transistor between a line of a first power-supply potential and said loop filter in response to that said first control signal is set to be at the activated level, and said first control circuit controls said first control potential such that predetermined constant current flows through said first transistor connected between the line of said first power-supply potential and said loop filter, based on the potential of said predetermined node, said first control circuit including a second transistor of a first conductivity type, whose first electrode is connected to the line of said first power-supply potential, and whose input electrode is connected to a second electrode of said second transistor, for outputting said first control potential from the second electrode, a third transistor of a second conductivity type whose first electrode is connected to the second electrode of said second transistor and whose input electrode receives the potential of said predetermined node, and a first resistance element connected between a second electrode of said third transistor and a line of a second power-supply potential.

2. The clock synchronizer according to claim 1, wherein said first control circuit further includes a second resistance element connected between the second electrode of said second transistor and the line of said second power-supply potential.

3. The clock synchronizer according to claims 1, wherein said variable current source further includes a fourth transistor of a first conductivity type, connected in parallel with said first transistor, whose input electrode receives a constant bias potential.

4. The clock synchronizer according to claim 1, further comprising:

a lock detection circuit for detecting whether or not the phase difference between said first and second clock signals is smaller than a predetermined level, setting a lock detection signal to be at an activated level when it is smaller, and setting said lock detection signal to be at an inactivated level when it is larger, said variable current source further including a fourth transistor of a first conductivity type whose input electrode receives a constant bias potential, said first switching circuit connecting said first transistor between the line of said first power-supply potential and said loop filter when said lock detection signal is at an activated level, and connecting said fourth transistor between the line of said first power-supply potential and said loop filter when said lock detection signal is at an inactivated level, in response to that said first control signal is set to be at an activated level.

5. The clock synchronizer according to claim 1, further comprising:

a lock detection circuit for detecting whether or not the phase difference between said first and second clock signals is smaller than a predetermined level, setting a lock detection signal to be at an activated level when it is smaller, and setting said lock detection signal to be at an inactivated level when it is larger, said variable current source further including a fourth transistor of a first conductivity type whose input electrode receives a second control potential, said first switching circuit connecting said first transistor between the line of said first power-supply potential and said loop filter when said lock detection signal is at an activated level, and connecting said fourth transistor between the line of said first power-supply potential and said loop filter when said lock detection signal is at an inactivated level, in response to that said first control signal is set to be at an activated level, said current-supply circuit further including a second control circuit for controlling said second control potential such that current flowing through said fourth transistor connected between the line of said first power-supply potential and said loop filter is increased in accordance with a potential difference between said first power-supply potential and a potential of said predetermined node, based on the potential of said predetermined node.

6. The clock synchronizer according to claim 1, wherein said first control signal is a signal for advancing a phase of said second clock signal:

said phase difference detection circuit sets said first control signal to be at an activated level for a time period corresponding to a phase difference between said first and second clock signals when the phase of said second clock signal is delayed with respect to said first clock signal, sets a second control signal for delaying the phase of said second clock signal to be at an activated level for a time period corresponding to a phase difference between said first and second clock signals when the phase of said second clock signal is advanced with respect to said first clock signal, and sets said first and second control signals to be at an activated level for a predetermined period of time when phases of said first and second clock signals agree with each other; and said current-supply circuit supplies current of a first polarity to said loop filter in response to that said first control signal is set to be at an activated level, and also supplies current of a second polarity to said loop filter in response to that said second control signal is set to be at an activated level.

7. The clock synchronizer according to claim 6, wherein said variable current source further includes a fourth transistor of a second conductivity type whose input electrode receives a second control potential; and said current-supply circuit includes a second switching circuit for connecting said fourth transistor between said loop filter and the line of said second power-supply potential in response to that said second control signal is set to be at an activated level, and a second control circuit for controlling said second control potential such that said predetermined constant current flows through said second transistor connected between said loop filter and the line of said second power-supply potential, based on a potential of said predetermined node.

8. The clock synchronizer according to claim 7, further comprising a precharge circuit for precharging said predetermined node to be at a predetermined potential in response to application of said first and second power-supply potentials.

9. The clock synchronizer according to claim 6, wherein said current-supply circuit further includes a fourth transistor of a second conductivity type whose input electrode receives a constant bias potential, and a second switching circuit connecting said fourth transistor between said loop filter and the line of said second power-supply potential in response to that said second control signal is set to be at an activated level.

10. The clock synchronizer according to claim 9, further comprising a precharge circuit for precharging said predetermined node to be at said first power-supply potential in response to application of said first and second power-supply potentials.

11. The clock synchronizer according to claim 1, wherein said first control signal is a signal for delaying the phase of said second clock signal, said phase difference detection circuit sets said first control signal to be at an activated level for a time period corresponding to a phase difference between said first and second clock signals when the phase of said second clock signal is advanced with respect to said first clock signal, sets a second control signal for advancing the phase of said second clock signal to be at an activated level for a time period corresponding to a phase difference between said first and second clock signals when the phase of said second clock signal is delayed with respect to said first clock signal, and sets said first and second control signals to be at an activated level for a predetermined period of time when the phases of said first and second clock signals agree with each other, and said current-supply circuit supplies current of a first polarity to said loop filter in response to that said first control signal is set to be at an activated level, and also supplies current of a second polarity to said loop filter in response to that said second control signal is set to be at an activated level.

12. The clock synchronizer according to claim 11, wherein said current-supply circuit further includes a fourth transistor of a second conductivity type whose input electrode receives a constant bias potential, and a second switching circuit for connecting said second transistor between said loop filter and the line of said second power-supply potential, in response to that said second control signal is set to be at an activated level.

13. The clock synchronizer according to claim 12, further comprising a precharge circuit for precharging said predetermined node to be at said first power-supply potential in response to application of said first and second power-supply potentials.

14. The clock synchronizer according to claim 1, wherein said variable current source further includes a variable potential source for outputting said first power-supply potential, the potential of which can be controlled; and said first control circuit further controls said variable potential source such that predetermined constant current flows through said first transistor connected between the output node of said variable potential source and said loop filter, based on a potential of said predetermined node.

15. The clock synchronizer according to claim 1, wherein said loop filter includes a resistance element and a capacitor connected in series between said predetermined node and a line of a reference potential.

16. A clock synchronizer generating a second clock signal synchronized with a first clock signal, comprising:

a phase difference detection circuit for detecting a phase difference between said first and second clock signals, and setting a control signal to be at an activated level for a time period corresponding to the phase difference;

a loop filter including a resistance element and a capacitor connected in series between a predetermined node and a line of a reference potential;

a current-supply circuit for supplying current to said loop filter in response to said control signal from said phase difference detection circuit; and a clock generating circuit for generating said second clock signal in accordance with a potential of said predetermined node;

said current-supply circuit including a first transistor whose input electrode receives a control potential, a switching circuit for connecting said first transistor between a line of a first power-supply potential and said loop filter, in response to that said control signal is set to be at an activated level, and a control circuit for controlling said control potential such that predetermined constant current flows through said first transistor connected between the line of said first power-supply potential and said loop filter, based on a potential of a node between said resistance element and said capacitor; and said control circuit including a second transistor of a first conductivity type, whose first electrode is connected to the line of said first power-supply potential, and whose input electrode is connected to a second electrode of said second transistor, for outputting said control potential from the second electrode, a third transistor of a second conductivity type whose first electrode is connected to the second electrode of said second transistor and whose input electrode receives the potential of said node between said resistance element and said capacitor, and a first resistance element connected between a second electrode of said third transistor and a line of a second power-supply potential.

* * * * *